(12) United States Patent
Higuchi et al.

(10) Patent No.: US 10,404,037 B2
(45) Date of Patent: Sep. 3, 2019

(54) SEMICONDUCTOR LASER DEVICE

(71) Applicant: HAMAMATSU PHOTONICS K.K., Hamamatsu-shi, Shizuoka (JP)

(72) Inventors: Akira Higuchi, Hamamatsu (JP); Yoshitaka Kurosaka, Hamamatsu (JP); Tadataka Edamura, Hamamatsu (JP); Masahiro Hitaka, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/027,709

(22) Filed: Jul. 5, 2018

(65) Prior Publication Data

US 2019/0013647 A1 Jan. 10, 2019

(30) Foreign Application Priority Data

Jul. 10, 2017 (JP) ................. 2017-134932

(51) Int. Cl.
*H01S 5/183* (2006.01)
*H01S 5/042* (2006.01)
*H01S 5/10* (2006.01)

(52) U.S. Cl.
CPC ........ *H01S 5/18394* (2013.01); *H01S 5/0425* (2013.01); *H01S 5/105* (2013.01); *H01S 5/1039* (2013.01); *H01S 5/18308* (2013.01)

(58) Field of Classification Search
CPC .... H01S 5/18394; H01S 5/105; H01S 5/0425; H01S 5/18; H01S 5/18308
See application file for complete search history.

(56) References Cited

U.S. PATENT DOCUMENTS

2007/0201527 A1* 8/2007 Hori ................... H01S 5/18333
372/50.124

FOREIGN PATENT DOCUMENTS

JP 2007-234727 A 9/2007
JP 2008-98379 A 4/2008

* cited by examiner

*Primary Examiner* — Michael Carter
(74) *Attorney, Agent, or Firm* — Drinker Biddle & Reath LLP

(57) ABSTRACT

A semiconductor laser device of an embodiment comprises: a first electrode having an opening for passage of laser light and arranged on a main surface of a substrate; and a second electrode arranged on a back surface of the substrate. A stacked structural body including an active layer and a photonic crystal layer is arranged between the substrate and the first electrode, and a current confinement layer having an opening for passage of a current is arranged between the stacked structural body and the first electrode. A maximum width of the opening of the current confinement layer is smaller than a maximum width of the opening of the first electrode, and a whole region defined by the opening of the current confinement layer fits within a region defined by the opening of the first electrode as viewed from the first electrode side toward the second electrode side.

6 Claims, 21 Drawing Sheets

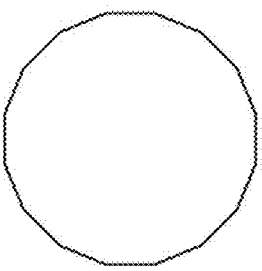
Fig.4A
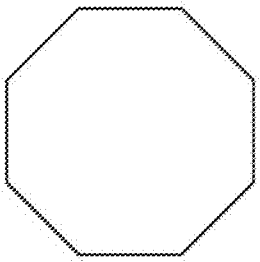
Fig.4B
Fig.4C
Fig.4D
Fig.4E
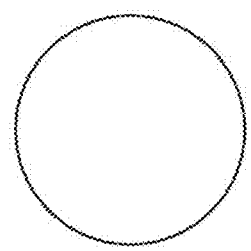
Fig.4F
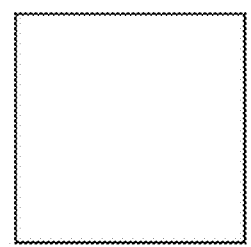
Fig.4G
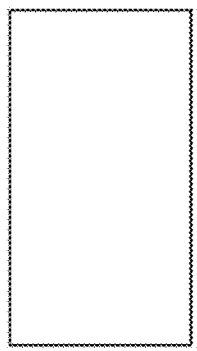
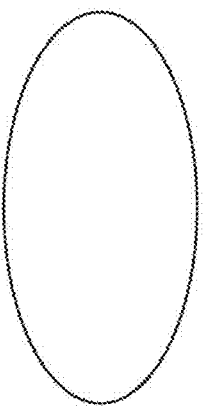

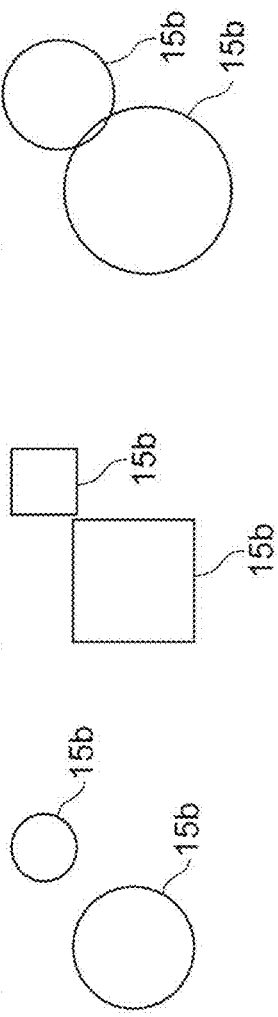
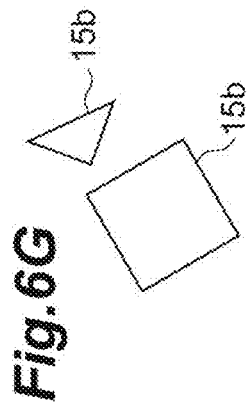
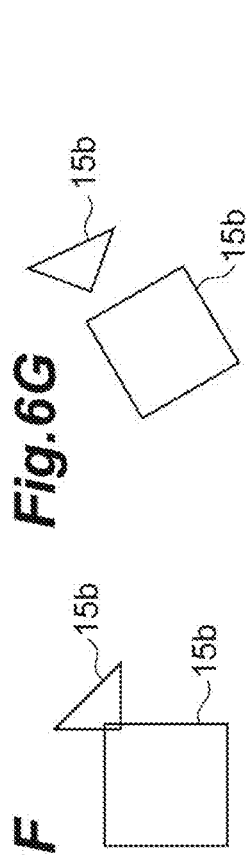

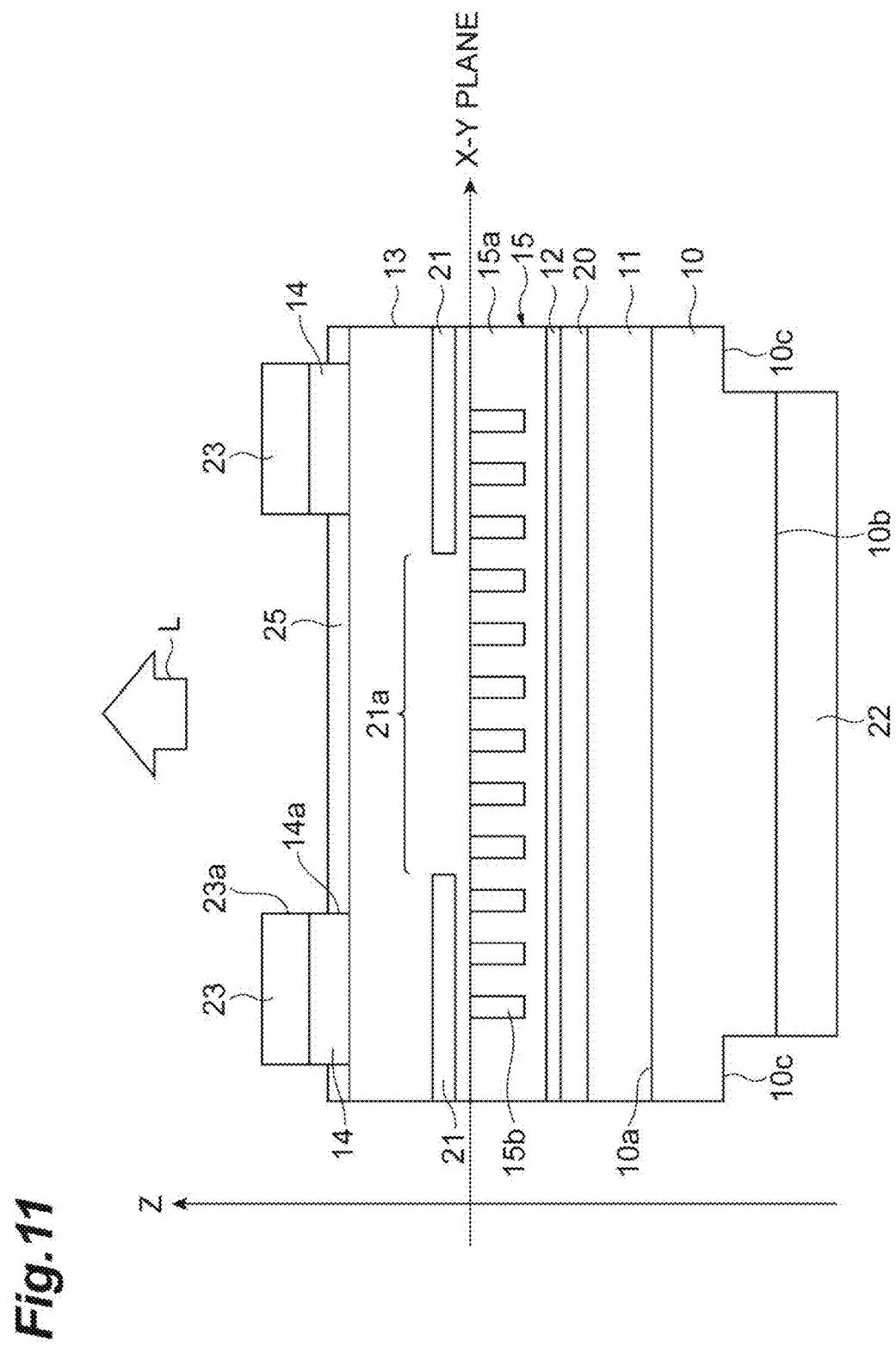

Fig.20

| LAYER STRUCTURE | REFRACTIVE INDEX | FILM THICKNESS (nm) | DOPING CONCENTRATION ($cm^{-3}$) | Γ |
|---|---|---|---|---|
| p-GaAs CONTACT LAYER | — | 200 | Zn:$1\times10^{20}$ | — |
| p-($Al_{0.7}Ga_{0.3}$)$_{0.5}In_{0.5}$P UPPER CLADDING LAYER | 3.21 | 5000 | Zn:$1\times10^{18}$ | 0.004 |
| Air/i-($Al_xGa_{1-x}$)$_{0.5}In_{0.5}$P(x~0.03) PHOTONIC CRYSTAL LAYER(FFave=15%) | 3.20 | 200 | — | 0.093 |
| i-($Al_xGa_{1-x}$)$_{0.5}In_{0.5}$P(x~0.03) PHOTONIC CRYSTAL LAYER | 3.45 | 20 | — | 0.038 |
| i-($Al_{0.3}Ga_{0.3}$)$_{0.5}In_{0.5}$P CARRIER BLOCK LAYER | 3.21 | 20 | — | 0.049 |
| i-($Al_xGa_{1-x}$)$_{0.5}In_{0.5}$P(x~0.03) BARRIER LAYER | 3.45 | 50 | — | 0.180 |
| i-GaInP WELL LAYER | 3.50 | 10 | — | 0.044 |
| i-($Al_xGa_{1-x}$)$_{0.5}In_{0.5}$P(x~0.03) BARRIER LAYER | 3.45 | 10 | — | 0.045 |
| i-GaInP WELL LAYER | 3.50 | 10 | — | 0.046 |
| i-($Al_xGa_{1-x}$)$_{0.5}In_{0.5}$P(x~0.03) BARRIER LAYER | 3.45 | 10 | — | 0.046 |
| i-GaInP WELL LAYER | 3.50 | 10 | — | 0.045 |
| i-AlGaInP(x~0.03) BARRIER LAYER | 3.45 | 60 | — | 0.219 |
| n-($Al_{0.6}Ga_{0.4}$)$_{0.5}In_{0.5}$P LOWER CLADDING LAYER | 3.24 | 2000 | Si:$1\times10^{18}$ | 0.192 |
| n-GaAs BUFFER LAYER | — | — | Si:$3\times10^{17}$ | 0.000 |
| n-GaAs SEMICONDUCTOR SUBSTRATE | — | — | — | — |

Fig.21

| LAYER STRUCTURE | REFRAC-TIVE INDEX | FILM THICKNESS (nm) | DOPING CONCENTRATION (cm$^{-3}$) | Γ |
|---|---|---|---|---|
| p-GaAs CONTACT LAYER | 3.64 | 200 | Zn:1×10$^{20}$ | 0.000 |
| p-Al$_{0.6}$GaAs UPPER CLADDING LAYER | 3.22 | 2000 | Zn:1×10$^{18}$ | 0.026 |
| Air/i-Al$_{0.3}$GaAs PHOTONIC CRYSTAL LAYER(FFave=17.5%) | 3.12 | 240 | — | 0.156 |
| i-Al$_{0.3}$GaAs PHOTONIC CRYSTAL LAYER | 3.40 | 40 | — | 0.070 |
| i-Al$_{0.3}$GaAs CARRIER BLOCK LAYER | 3.10 | 25 | — | 0.077 |
| i-Al$_{0.3}$GaAs BARRIER LAYER | 3.40 | 10 | — | 0.035 |
| i-GaAs WELL LAYER | 3.55 | 10 | — | 0.037 |
| i-Al$_{0.3}$GaAs BARRIER LAYER | 3.40 | 10 | — | 0.039 |
| i-GaAs WELL LAYER | 3.55 | 10 | — | 0.041 |
| i-Al$_{0.3}$GaAs BARRIER LAYER | 3.40 | 10 | — | 0.042 |
| i-GaAs WELL LAYER | 3.55 | 10 | — | 0.042 |
| i-Al$_{0.3}$GaAs BARRIER LAYER | 3.40 | 80 | — | 0.271 |
| n-Al$_{0.6}$GaAs LOWER CLADDING LAYER | 3.10 | 2000 | Si:1×10$^{18}$ | 0.165 |
| n-GaAs BUFFER LAYER | 3.64 | SEVERAL HUNDREDS | Si:3×10$^{17}$ | — |
| n-GaAs SEMICONDUCTOR SUBSTRATE | — | — | — | — |

SEMICONDUCTOR LASER DEVICE

TECHNICAL FIELD

The present invention relates to a semiconductor laser device.

BACKGROUND

Japanese Patent Application Laid-Open No. 2008-98379 (Patent Document 1) discloses a technique relating to a two-dimensional photonic crystal-surface emitting laser device (hereinafter referred to as a "photonic crystal laser") as a semiconductor laser device and a manufacturing method thereof. The surface emitting laser device includes a substrate, a lower cladding layer provided on the substrate, an active layer provided on the lower cladding layer and emitting light by injection of carriers, and an upper cladding layer provided on the active layer. The two-dimensional photonic crystal has a structure in which voids having a depth reaching the lower cladding layer from the upper cladding layer through the active layer are periodically arranged along a main surface of the active layer.

Japanese Patent Application Laid-Open No. 2007-234727 (Patent Document 2) discloses a technique relating to a surface emitting laser device (semiconductor laser device). This surface emitting laser device includes a photonic crystal layer in which pores are two-dimensionally arranged on a plane orthogonal to a stacking direction on a substrate. A cladding layer having an oxidized region, which has been oxidized through the pores, and an unoxidized region is provided between the substrate and the photonic crystal layer. A refractive index of the oxidized region is lower than a refractive index of the photonic crystal layer. The photonic crystal layer and the unoxidized region of the cladding layer include Al, Ga, and As.

SUMMARY

As a result of examining the conventional semiconductor laser devices, the inventors have found out the following problems. That is, in recent years, a photonic crystal laser using two-dimensional photonic crystals has been studied. The photonic crystal laser includes a photonic crystal layer in which a plurality of modified refractive index regions having a refractive index different from a refractive index of a basic layer are periodically arranged in a two-dimensional manner in the basic layer as well as an active layer and a cladding layer. Light generated in the active layer forms a two-dimensional standing wave in the photonic crystal layer and oscillates along a horizontal direction orthogonal to a stacking direction of the photonic crystal layer to form laser light, and as a result, is emitted along the stacking direction.

As described above, the laser light is emitted along the stacking direction in the photonic crystal laser. At that time, an opening configured to allow the laser light to pass therethrough is formed in an electrode such that emission of the laser light is not hindered by the electrode. In general, the electrode having the opening is provided on a back surface of a semiconductor substrate. This is because the semiconductor substrate has a sufficient thickness as compared with other semiconductor layers, and thus, can sufficiently diffuse a current even to a region of the active layer overlapping with this opening. A structure that emits the laser light from the back surface of the semiconductor substrate in this manner is called a back-surface-emitting type.

However, a problem may be sometimes caused in the back-surface-emitting photonic crystal laser depending on a wavelength of the laser light. That is, absorption of light in the semiconductor substrate becomes conspicuous depending on the wavelength of the laser light since the semiconductor substrate is much thicker than the other semiconductor layers as described above. In this case, the efficiency of emission of the laser light is lowered.

The invention has been made to solve the above problem, and an object thereof is to provide a semiconductor laser device having a structure for enhancing emission efficiency of laser light.

In order to solve the above-described problem, a semiconductor laser device according to an embodiment comprises at least a semiconductor substrate, a first cladding layer, an active layer, a second cladding layer, a contact layer, a first electrode, a second electrode, a photonic crystal layer, and a current confinement layer. The semiconductor substrate has a main surface and a back surface opposing the main surface. The first cladding layer is a layer provided on the main surface of the semiconductor substrate. The active layer is a layer provided on the first cladding layer. The second cladding layer is a layer provided on the active layer. The contact layer is a layer provided on the second cladding layer. The first electrode is a metal layer provided on the contact layer. The second electrode is a metal layer provided on the back surface of the semiconductor substrate. The photonic crystal layer is a layer provided in one of a space between the first cladding layer and the active layer and a space between the active layer and the second cladding layer. The current confinement layer is a layer provided in the second cladding layer, and has a first opening configured to allow a current to pass therethrough.

In the embodiment, the photonic crystal layer has a basic layer and a plurality of modified refractive index regions each of which has a refractive index different from a refractive index of the basic layer. In addition, the plurality of modified refractive index regions are arranged in the state of being separated from each other on a cross section of the photonic crystal layer orthogonal to a normal direction of the main surface of the semiconductor substrate. The first electrode has a second opening configured to allow laser light to pass therethrough. A maximum width of the first opening defined along a horizontal direction orthogonal to the normal direction is smaller than a maximum width of the second opening defined along the horizontal direction. When the second electrode side is viewed from the first electrode side along the normal direction, the first opening and the second opening are arranged such that a whole first region defined by the first opening falls within a second region defined by the second opening.

BRIEF DESCRIPTION OF THE DRAWINGS

FIGS. 4A to 4G are diagrams illustrating examples of a mirror-image symmetric shape among shapes of a modified refractive index region on the X-Y plane;

FIGS. 6A to 6K are diagrams illustrating examples of the shape of the modified refractive index region;

FIG. 11 is a view illustrating another modified example relating to the shape of the semiconductor substrate;

FIG. 20 is a table illustrating a specific layer structure (first specific example) of the semiconductor laser device according to the embodiment; and FIG. 21 is a table illustrating a specific layer structure (second specific example) of the semiconductor laser device according to the embodiment.

DETAILED DESCRIPTION

Figure 1:
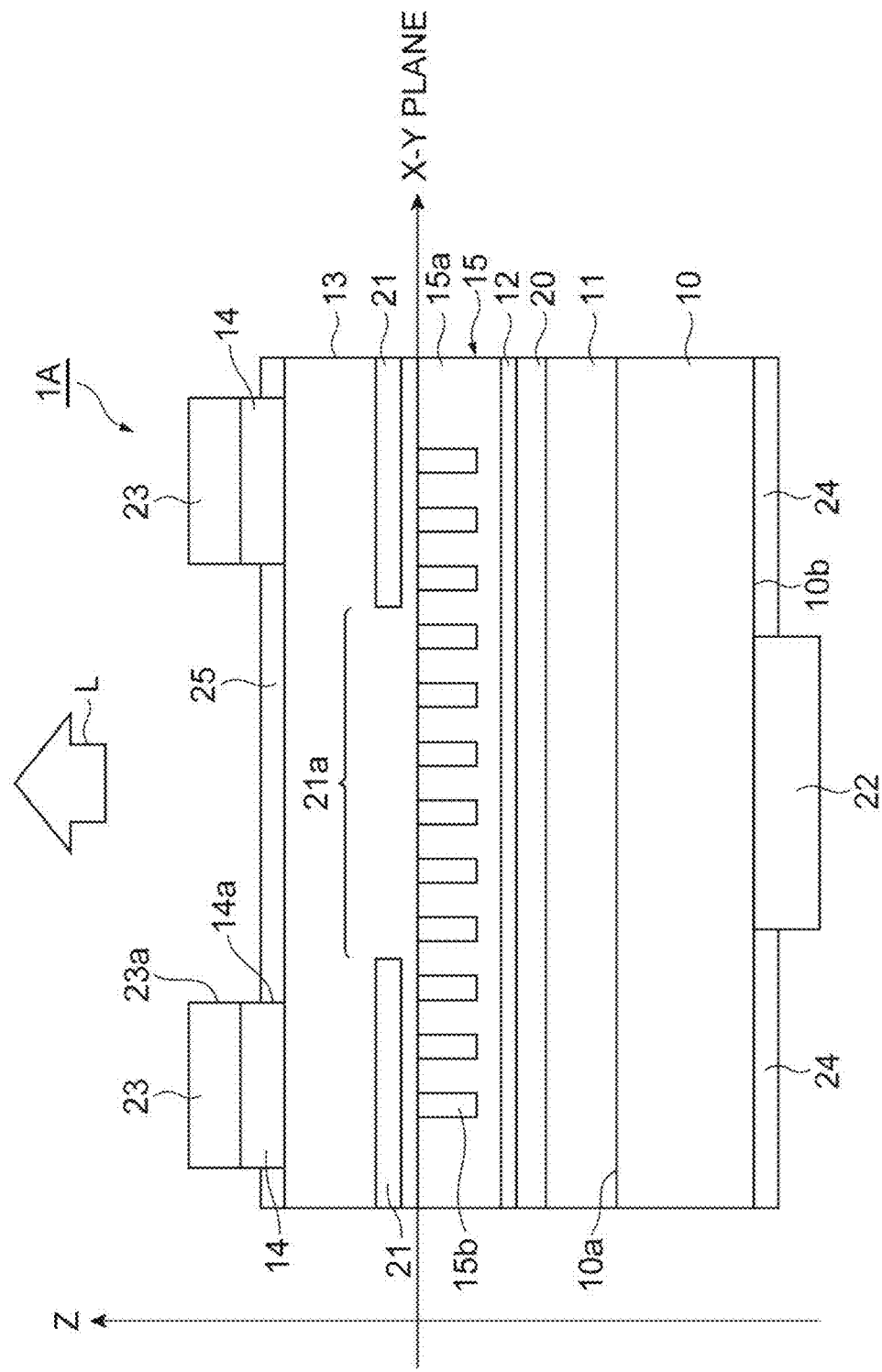
FIG. 1 is a view illustrating one configuration example of a semiconductor laser device according to an embodiment.

[Description of Embodiment of Invention of Present Application]

First, the content of an embodiment of the invention according to the present application will be individually listed and described.

(1) One aspect of a semiconductor laser device according to the embodiment comprises at least a semiconductor substrate, a first cladding layer, an active layer, a second cladding layer, a contact layer, a first electrode, a second electrode, a photonic crystal layer, and a current confinement layer. The semiconductor substrate has a main surface and a back surface opposing the main surface. The first cladding layer is a layer provided on the main surface of the semiconductor substrate. The active layer is a layer provided on the first cladding layer. The second cladding layer is a layer provided on the active layer. The contact layer is a layer provided on the second cladding layer. The first electrode is a metal layer provided on the contact layer. The second electrode is a metal layer provided on the back surface of the semiconductor substrate. The photonic crystal layer is a layer provided in one of a space between the first cladding layer and the active layer and a space between the active layer and the second cladding layer. The current confinement layer is a layer provided in the second cladding layer, and has a first opening configured to allow a current to pass therethrough.

In the embodiment, the photonic crystal layer has a basic layer and a plurality of modified refractive index regions each of which has a refractive index different from a refractive index of the basic layer. In addition, the plurality of modified refractive index regions are arranged in the state of being separated from each other on a cross section (substantially including a front surface of the photonic crystal layer in which the modified refractive index regions are exposed) of the photonic crystal layer orthogonal to a normal direction of the main surface of the semiconductor substrate. The first electrode has a second opening configured to allow laser light to pass therethrough. A maximum width of the first opening defined along a horizontal direction orthogonal to the normal direction is smaller than a maximum width of the second opening defined along the horizontal direction. When the second electrode side is viewed from the first electrode side along the normal direction, the first opening and the second opening are arranged such that a whole first region defined by the first opening falls within a second region defined by the second opening. Incidentally, a normal direction of the main surface of the semiconductor substrate coincides with a thickness direction of the photonic crystal layer.

In the semiconductor laser device having the above-described structure, an opening (second opening) is formed in the first electrode provided on the contact layer. That is, the semiconductor laser device is a front-surface emitting laser device that emits laser light from a side (a side of the contact layer) opposite to the back surface of the semiconductor substrate. Therefore, a loss caused by absorption of light in the semiconductor substrate is reduced, and it is possible to enhance emission efficiency of the laser light.

In addition, it is a problem to sufficiently diffuse a current to a region of the active layer overlapping with an opening of an electrode in the case of the front-surface-emitting laser device. Therefore, in the semiconductor laser device according to the embodiment, the current confinement layer is provided in the second cladding layer. The current confinement layer has an opening (first opening) configured to allow a current to pass therethrough. The maximum width of the first opening defined along the horizontal direction orthogonal to the normal direction of the main surface of the semiconductor substrate is smaller than the maximum width of the second opening defined along the horizontal direction. Further, when the second electrode side is viewed from the first electrode side along the normal direction, the first opening and the second opening are arranged such that the whole first region defined by the first opening falls within the second region defined by the second opening. According to such a configuration, it is possible to sufficiently diffuse the current also to the region of the active layer overlapping with the opening of the electrode.

(2) As one aspect of the embodiment, the semiconductor laser device may further include a light reflection layer provided between a stacked structural body including the active layer and the photonic crystal layer and the semiconductor substrate. In this case, the loss caused by absorption of light in the semiconductor substrate is avoided, and as a result, it is possible to further enhance the emission efficiency of the laser light. In addition, the light reflection layer may be a DBR (Distributed Bragg Reflector) layer as one aspect of the embodiment. In this case, it is possible to easily form the light reflection layer in the same process as the other semiconductor layers. Further, as one aspect of the embodiment, the light reflection layer may be provided between a stacked structural body (including at least the active layer and the photonic crystal layer) and the first cladding layer. In this case, a loss caused by absorption of light in the first cladding layer can also be avoided, and thus, it is possible to further enhance the emission efficiency of the laser light.

(3) As one aspect of the embodiment, a distance between the contact layer and the current confinement layer, defined along the normal direction, is 2 μm or longer. Incidentally, the normal direction of the main surface of the semiconductor substrate coincides with a thickness direction of the second cladding layer. As the sufficiently long distance between the contact layer and the current confinement layer is secured in this manner, the current easily diffuses to the vicinity of the center of the opening (first opening) of the current confinement layer. As a result, it is possible to sufficiently diffuse the current to the region of the active layer overlapping with the opening of the electrode.

(4) As one aspect of the embodiment, a band gap of each layer existing between the contact layer and the active layer is preferably larger than a band gap of the active layer. In this case, the absorption of light between the contact layer and the active layer is reduced, and as a result, it is possible to further enhance the emission efficiency of the laser light.

(5) As one aspect of the embodiment, the maximum width of the second electrode defined along the horizontal direction (the direction orthogonal to the normal direction of the main surface of the semiconductor substrate) may be smaller than the maximum width of the first opening. Further, when the second electrode side is viewed from the first electrode side along the normal direction of the main surface of the semiconductor substrate, the second electrode may be arranged such that the entire second electrode fits within the first region defined by the first opening. Incidentally, the second electrode may be formed on the entire back surface of the semiconductor substrate. In addition, in any configuration, grooves may be formed around the device on the back surface of the semiconductor substrate in order to suppress wrap-around of solder at the time of assembling the device. In this case, for example, a width of the groove can set to about 5 μm to 50 μm and a depth thereof can be set to about 5 μm to 50 μm. In addition, preferably, the width of the groove is about 30 μm and the depth thereof is about 10 μm.

As described above, each aspect listed in [Description of Embodiment of Invention of Present Application] can be applied to each of the remaining aspects or to all the combinations of these remaining aspects.

[Details of Embodiment of Invention of Present Application]

In the following, a specific structure of the semiconductor laser device according to the embodiment will be described in detail with reference to the attached drawings. Incidentally, the invention is not limited to these various examples, but is illustrated by the claims, and equivalence of and any modification within the scope of the claims are intended to be included therein. In addition, the same elements in the description of the drawings will be denoted by the same reference signs, and redundant descriptions will be omitted.

FIG. 1 is a view illustrating an example of a configuration of a laser device 1A as the semiconductor laser device according to the embodiment. Incidentally, an XYZ orthogonal coordinate system in which a thickness direction of the laser device 1A coincides with the Z-axis is defined. The laser device 1A forms a standing wave in a direction along the X-Y plane and outputs laser light L in a direction (Z-axis direction) orthogonal to a main surface 10a of a semiconductor substrate 10. However, the laser device 1A according to the embodiment outputs the laser light L from a front surface on an upper cladding layer 13 rather than outputting the laser light L having passed through the semiconductor substrate 10 from a back surface 10b. Incidentally, the thickness direction of the laser device 1A coinciding with the Z-axis direction is synonymous with a stacking direction of the respective layers provided on the semiconductor substrate 10 and is also synonymous with the normal direction of the main surface 10a of the semiconductor substrate 10. In addition, the X-Y plane is set so as to coincide with a plane of the photonic crystal layer 15 to which a plurality of modified refractive index regions 15b are exposed.

The laser device 1A includes the semiconductor substrate 10. In addition, the laser device 1A includes a lower cladding layer 11 (first cladding layer), an active layer 12, the upper cladding layer 13 (second cladding layer), a contact layer 14, the photonic crystal layer 15, and a current confinement layer 21 which are provided on the main surface 10a of the semiconductor substrate 10. The laser device 1A may further include a light reflection layer 20 if necessary. The lower cladding layer 11 is provided on the main surface 10a of the semiconductor substrate 10. The active layer 12 is provided on the lower cladding layer 11. The upper cladding layer 13 is provided on the active layer 12. The contact layer 14 is provided on the upper cladding layer 13. The photonic crystal layer 15 is provided between the active layer 12 and the upper cladding layer 13. The light reflection layer 20 is provided between the stacked structural body and the lower cladding layer 11. Incidentally, the stacked structural body includes the active layer 12 and the photonic crystal layer 15. The current confinement layer 21 is provided in the upper cladding layer 13. The semiconductor substrate 10 and the layers 11 to 15 and 20 are configured using a compound semiconductor such as a GaAs-based semiconductor, an InP-based semiconductor, and a nitride-based semiconductor.

An energy band gap of the lower cladding layer 11 is larger than an energy band gap of the active layer 12. In addition, a band gap of each layer existing between the contact layer 14 and the active layer 12 (specifically, the upper cladding layer 13, the photonic crystal layer 15, and the current confinement layer 21) is larger than the band gap of the active layer 12. As a result, absorption of the laser light L between the contact layer 14 and the active layer 12 can be reduced, and emission efficiency of the laser light L can be enhanced.

A light guide layer may be provided in at least one of a space between the active layer 12 and the upper cladding layer 13 and a space between the active layer 12 and the lower cladding layer 11 if necessary. When the light guide layer is provided between the active layer 12 and the upper cladding layer 13, the photonic crystal layer 15 is provided between the upper cladding layer 13 and the light guide layer.

Figure 2:
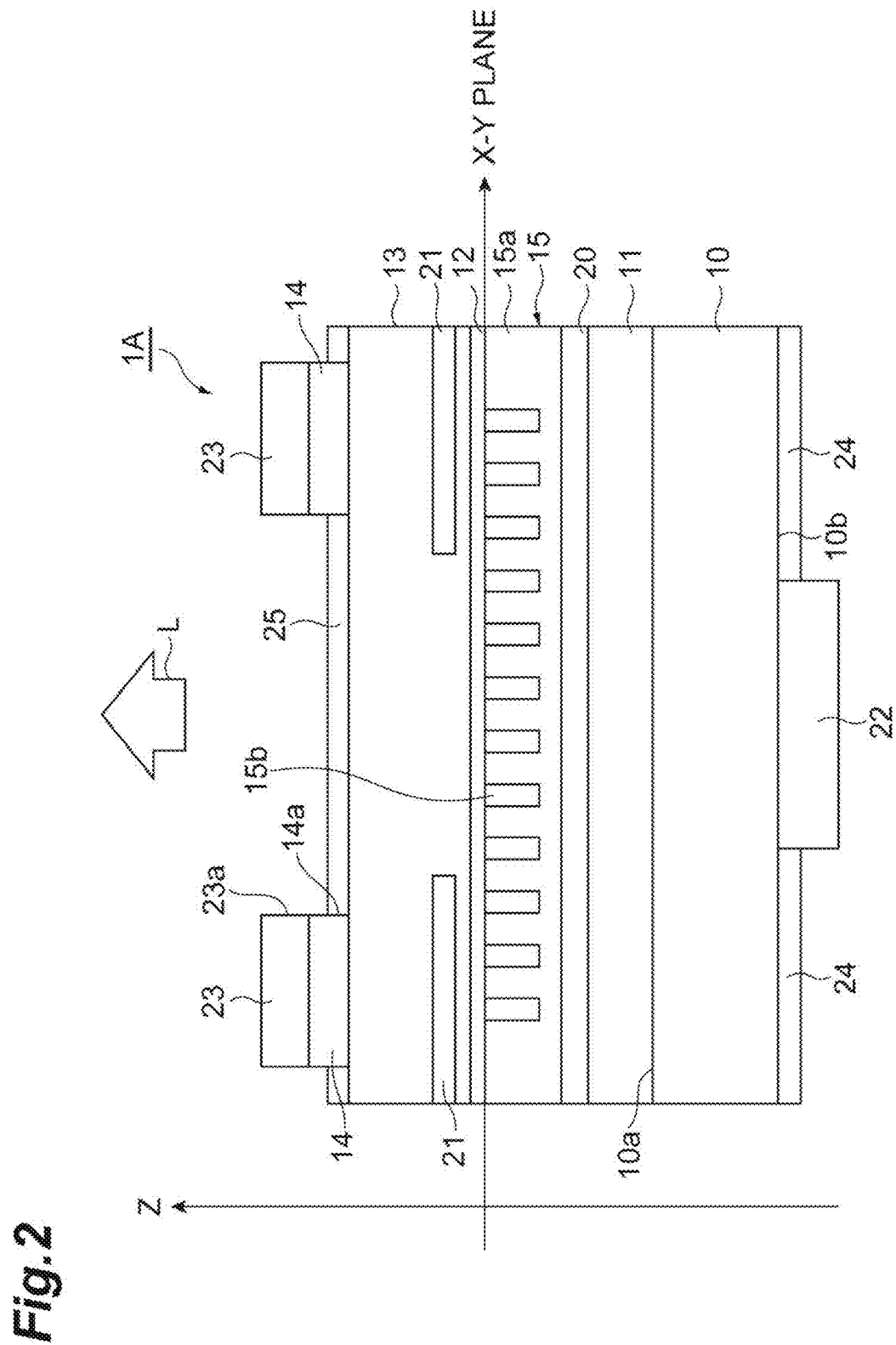
FIG. 2 is a view illustrating another configuration example in which a photonic crystal layer is provided between a lower cladding layer and an active layer.

Although the photonic crystal layer 15 is provided between the active layer 12 and the upper cladding layer 13 in the embodiment, the photonic crystal layer 15 may be provided between the lower cladding layer 11 and the active layer 12 as illustrated in FIG. 2. Further, when the light guide layer is provided between the active layer 12 and the lower cladding layer 11, the photonic crystal layer 15 is provided between the lower cladding layer 11 and the light guide layer.

The photonic crystal layer (diffraction grating layer) 15 has a basic layer 15a made of a first refractive index medium and the plurality of modified refractive index regions 15b made of a second refractive index medium having a modified refractive index from the first refractive index medium. Incidentally, each of the plurality of modified refractive index regions 15b exists in the basic layer 15a. The plurality of modified refractive index regions 15b are periodically arranged on a plane (on the X-Y plane) orthogonal to the thickness direction (direction along the Z-axis) of the photonic crystal layer 15. When an effective refractive index of the photonic crystal layer 15 is set as n, a wavelength $\lambda_0$ (=a×n, a is a lattice distance) selected by the photonic crystal layer 15 is included within an emission wavelength range of the active layer 12. The photonic crystal layer 15 can select the wavelength $\lambda_0$ of the emission wavelength of the active layer 12 and output the selected wavelength to the outside.

Figure 3:
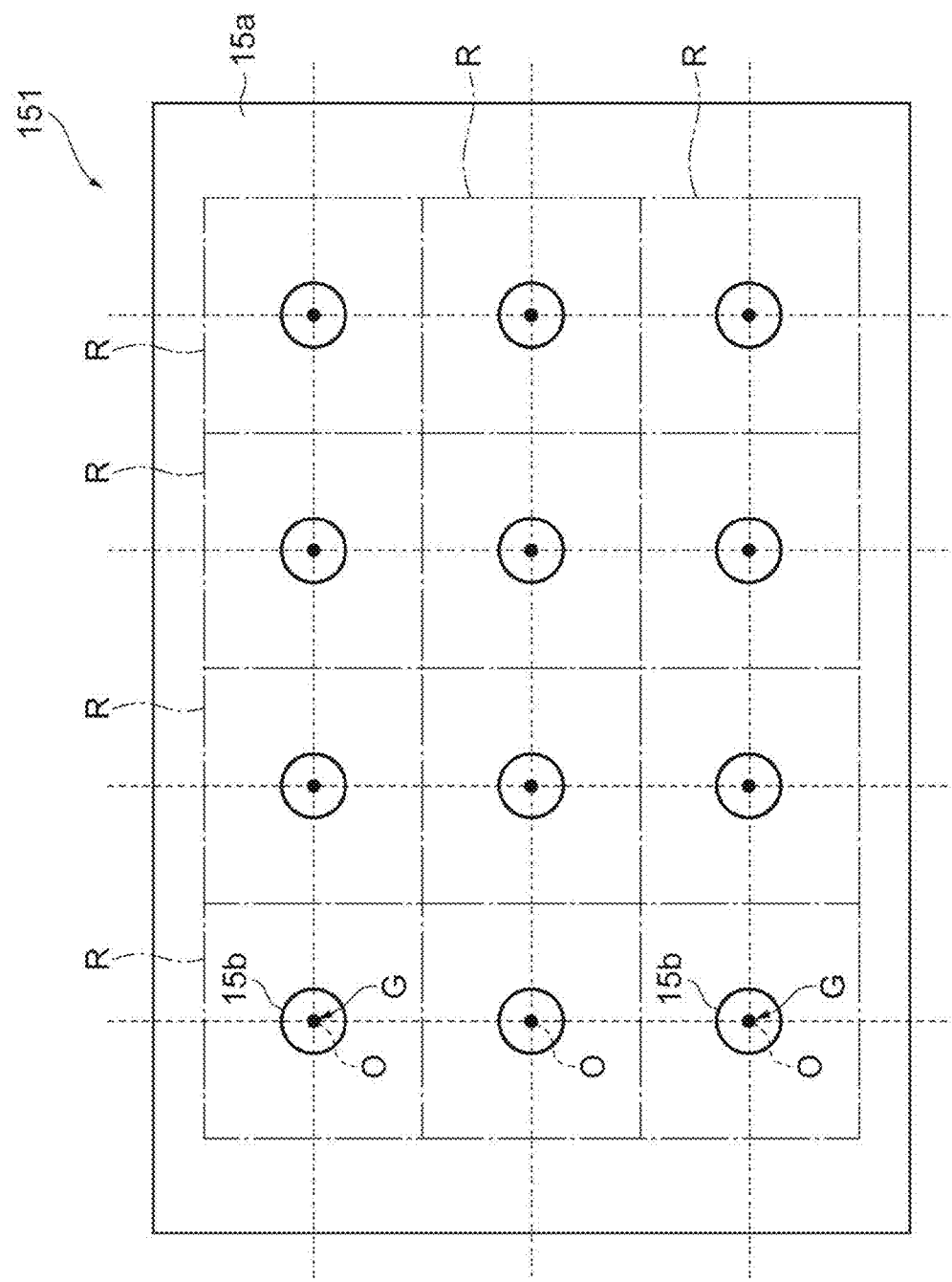
FIG. 3 is a plan view of the photonic crystal layer.

FIG. 3 is a plan view of the photonic crystal layer 15. Here, a virtual square lattice is set on a plane 151 of the photonic crystal layer 15 that coincides with the X-Y plane. One side of the square lattice is parallel to the X-axis and the other side is parallel to the Y-axis. At this time, unit configuration regions R each of which has a square shape with a lattice point O of the square lattice as the center thereof can be set two-dimensionally over a plurality of columns along the X-axis and a plurality of rows along the Y-axis. Incidentally, each of the lattice points O is positioned at the center of the corresponding unit configuration region R. The plurality of modified refractive index regions 15b are provided in each of the unit configuration regions R one by one or a predetermined number of two or more of the modified refractive index regions 15b are provided in each of the unit configuration regions R. A planar shape of the modified refractive index region 15b is, for example, a circular shape. In each of the unit configuration regions R, a center of gravity G of the modified refractive index region 15b overlaps with (matches) each of the lattice points O. Incidentally, the periodic structure of the plurality of modified refractive index regions 15b is not limited thereto, and for example, a triangular lattice may be set instead of the square lattice.

Although FIG. 3 illustrates the example in which the modified refractive index region 15b on the X-Y plane has the circular shape, the modified refractive index region 15b may have a shape other than the circular shape. For example, the shape of the modified refractive index region 15b on the X-Y plane may have a mirror-image symmetry (line symmetry). Here, the mirror-image symmetry (line symmetry) represent that a planar shape of the modified refractive index region 15b positioned on one side of a straight line and a planar shape of the modified refractive index region 15b positioned on the other side of the straight line can be mirror-image symmetric (line symmetric) with each other with the certain straight line on the X-Y plane interposed therebetween. Examples of a shape having mirror-image symmetry (line symmetry) includes a perfect circle illustrated in FIG. 4A, a square illustrated in FIG. 4B, a regular hexagon illustrated in FIG. 4C, a regular octagon illustrated in FIG. 4D, a regular hexadecagon illustrated in FIG. 4E, a rectangle illustrated in FIG. 4F, an ellipse illustrated in FIG. 4G, and the like.

Figure 5A:
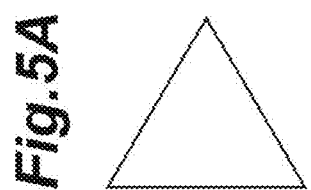
FIGS. 5A to 5K are diagrams illustrating examples of shapes that do not have a 180-degree rotational symmetry out of the shapes of the modified refractive index region on the X-Y plane.
Figure 5B:
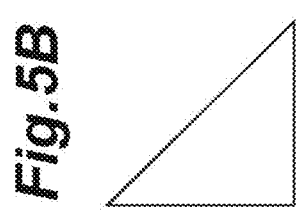
Figure 5C:
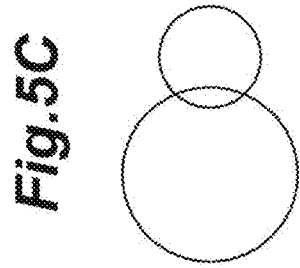
Figure 5D:
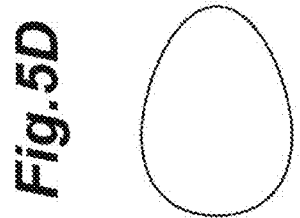
Figure 5E:
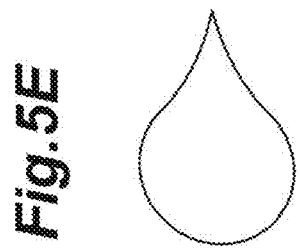
Figure 5F:
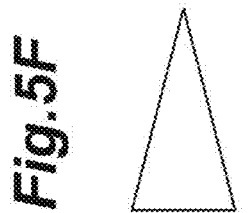
Figure 5G:
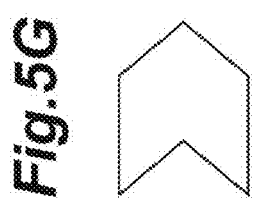
Figure 5H:
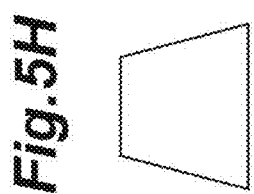
Figure 5I:
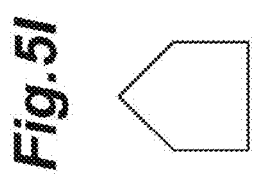
Figure 5J:
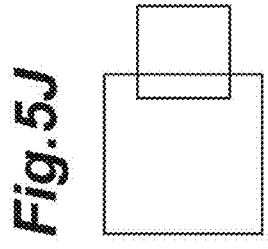
Figure 5K:
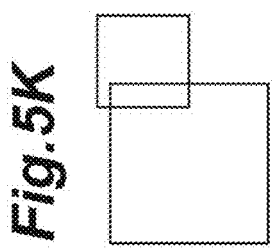

In addition, the shape of the modified refractive index region 15b on the X-Y plane may have a shape that does not have a 180-degree rotational symmetry. Examples of such a shape include an equilateral triangle illustrated in FIG. 5A, a right-angled isosceles triangle illustrated in FIG. 5B, a shape in which two circles or ellipses partially overlap with each other illustrated in FIG. 5C, an egg shape illustrated in FIG. 5D, a teardrop shape illustrated in FIG. 5E, an isosceles triangle illustrated in FIG. 5F, an arrow shape illustrated in FIG. 5C; a trapezoid illustrated in FIG. 5H, a pentagon illustrated in FIG. 5I, a shape in which two rectangles partially overlap with each other illustrated in FIG. 5J, a shape in which two rectangles partially overlap with each other without mirror-image symmetry illustrated in FIG. 5K, and the like. Incidentally, the "egg shape" is a shape deformed such that a dimension of an ellipse in a short-axis direction in the vicinity of one end portion along a long axis is smaller than a dimension in the short-axis direction in the vicinity of the other end portion as illustrated in FIG. 5D. As illustrated in FIG. 5E, the "teardrop shape" is a shape obtained by deforming one end portion along the long axis of the ellipse into a sharp end portion protruding along a long-axis direction. As illustrated in FIG. 5Q the "arrow shape" is a shape in which one side of a rectangle is recessed in a triangle shape and a side opposing the one side is made sharp into a triangle shape. Since the shape of the modified refractive index region 15b on the X-Y plane does not have the 180-degree rotational symmetry in this manner, it is possible to obtain a higher light output.

In addition, a plural number of the modified refractive index regions 15b may be provided in each of the unit configuration regions R as illustrated in FIGS. 6A to 6K. FIGS. 6A and 6B illustrate a mode in which two modified refractive index regions 15b included in one unit configuration region R have figures that have the same shape and centers of gravity separated from each other. FIGS. 6C and 6D illustrate a mode in which the two modified refractive index regions 15b have figures that have the same shape and centers of gravity separated from each other and partially overlap each other. FIG. 6E illustrates a mode in which the two modified refractive index regions 15b have figures that have the same shape and centers of gravity separated from each other, and a relative angle of the modified refractive index region 15b is arbitrarily set for each lattice point O (rotated by an arbitrary angle). FIG. 6F illustrates a mode in which the two modified refractive index regions 15b have figures that have different shapes and centers of gravity separated from each other. FIG. 6G illustrates a mode in which the two modified refractive index regions 15b have figures that have different shapes and centers of gravity separated from each other, and a relative angle of the modified refractive index region 15b is arbitrarily set (rotated by an arbitrary angle) in each of the unit configuration regions R. Among them, the two modified refractive index regions 15b rotate so as not to overlap with each other in FIGS. 6E and 6G.

FIGS. 6H to 6K also illustrate a case where three modified refractive index regions 15b are included in one unit configuration region. FIG. 6H illustrates a mode in which the three regions 15b have figures that have the same shape. FIG. 6I illustrates a mode in which two of the three modified refractive index regions 15b have a figure different from a figure of the other. FIG. 6J illustrates a mode in which an angle of a straight line connecting the two modified refractive index regions 15b with respect to the X-axis and an angle of the other modified refractive index region 15b with respect to the X-axis are arbitrarily set in each of the unit configuration regions R. FIG. 6K illustrates a mode in which an angle of a straight line connecting the two modified refractive index regions 15b with respect to the X-axis is arbitrarily set for each of the unit configuration regions R while the three modified refractive index regions 15b maintain the same relative angle to each other. Among them, the three modified refractive index regions 15b may rotate so as not to overlap with each other in FIGS. 6J and 6K.

Figure 7:
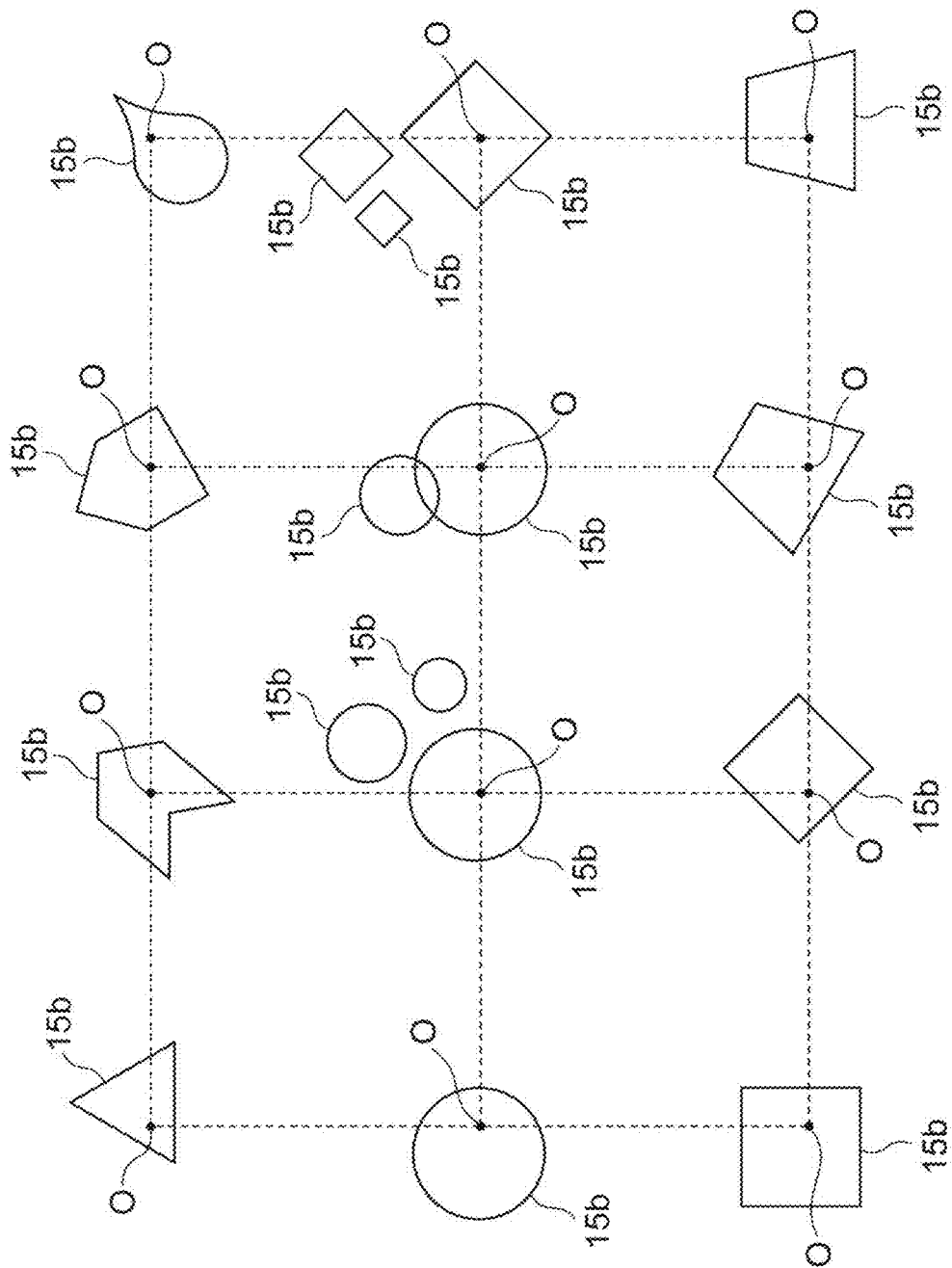
FIG. 7 is a view illustrating other examples of the shape of the modified refractive index region.

The shapes of the modified refractive index regions on the X-Y plane may be the same between lattice points. That is, the modified refractive index regions may have the same figure at all lattice points and can be caused to overlap with each other between the lattice points by a translational operation or the translational operation and a rotational operation. In that case, a fluctuation of a photonic band structure is reduced, and a spectrum having a narrow line width can be obtained. Alternatively, the shapes of the modified refractive index regions on the X-Y plane may not necessarily be the same between the lattice points. For example, the shapes may be different from each other between adjacent lattice points as illustrated in FIG. 7.

Although the modified refractive index region 15b is a void in the above structure, the modified refractive index region 15b may be formed by embedding a semiconductor having a modified refractive index different from the basic layer 15a in the void. In that case, for example, a void may be formed by etching in the basic layer 15a, and then, a semiconductor may be embedded in the void using a metal organic chemical vapor deposition method, a sputtering method, or an epitaxial method. In addition, the modified refractive index region 15b may be formed by embedding the semiconductor in the void of the basic layer 15a, and then, the same semiconductor as the modified refractive index region 15b may be further deposited thereon. Incidentally, when the modified refractive index region 15b is the void, the void may be filled with an inert gas such as argon, nitrogen, and hydrogen or air.

Figure 8:
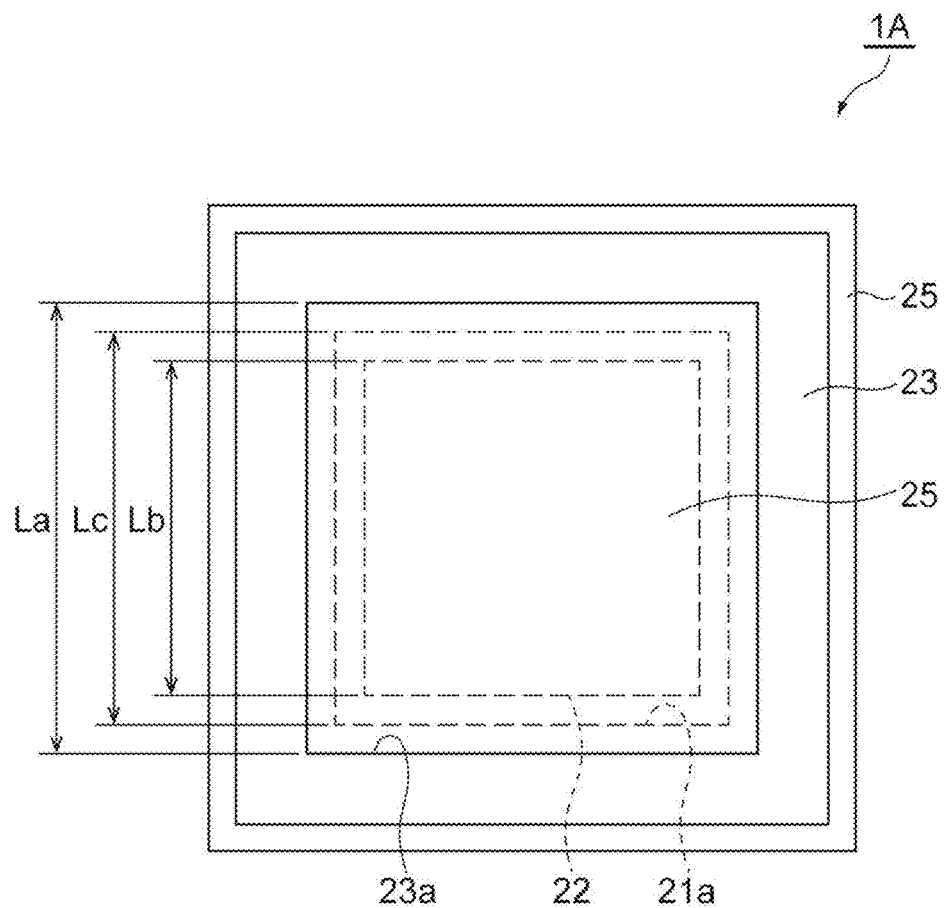
FIG. 8 is a plan view of the semiconductor laser device illustrated in FIG. 1 as viewed from a first electrode side (front surface side)

Referring again to FIG. 1, the laser device 1A includes an electrode 23 (first electrode) provided on the contact layer 14 and an electrode 22 (second electrode) provided on the back surface 10b of the semiconductor substrate 10. The electrode 23 makes ohmic contact with the contact layer 14, and the electrode 22 makes ohmic contact with the semiconductor substrate 10. FIG. 8 is a plan view of the laser device 1A as viewed from the electrode 23 side (front surface side). As illustrated in FIG. 8, the electrode 23 has a frame-shaped (annular) planar shape and has an opening 23a (second opening). Although the frame-shaped electrode 23 having a square shape is illustrated in FIG. 8, various shapes such as an annular shape can be adopted as the planar shape of the electrode 23. In addition, shapes of the electrode 22 and the opining 21a of the current confinement layer 21 indicated by a broken line in FIG. 8 is similar to a shape of the opening 23a of the electrode 23, and is, for example, a square or a circle. An opening width (which is a length of one side when the shape of the opening 23a is a square, and a maximum width is the length of a diagonal line) La of the opening 23a of the electrode 23 is, for example, 20 µm to 50 µm. The length Lb of one side of the electrode 22 is shorter than Lb of the opening 23a of the electrode 23. An opening width Lb of the opening 21a of the current confinement layer 21 is longer than Lc and is shorter than La. In the example of FIG. 8, each maximum width of the opening 23a of the electrode 23, the electrode 22, and the opening 21a of the current confinement layer 21 is defined by the length of the diagonal line of the square.

The contact layer 14 of the embodiment has the same planar shape as the electrode 23. That is, the contact layer 14 has an opening 14a formed by removing a central portion thereof by etching. Therefore, the contact layer 14 has a frame-shaped (annular) planar shape. The laser light L emitted from the laser device 1A passes through the opening 14a of the contact layer 14 and the opening 23a of the electrode 23. As the laser light L is caused to pass through the opening 14a of the contact layer 14, the light absorption in the contact layer 14 is avoided, and it is possible to enhance light emission efficiency. When it is possible to allow the light absorption in the contact layer 14, however, the contact layer 14 may cover the entire surface of the upper cladding layer 13 without forming the opening 14a. As the laser light L passes through the opening 23a of the electrode 23, the laser light L can be suitably emitted from the front surface side of the laser device 1A without being blocked by the electrode 23.

A front surface of the upper cladding layer 13 (or a front surface of the contact layer 14 when the opening 14a is not provided) exposed from the opening 14a of the contact layer 14 is covered with an anti-reflection film 25. The anti-reflection film 25 may also be provided outside the contact layer 14. In addition, a part other than the electrode 22 on the back surface 10b of the semiconductor substrate 10 is covered with a protective film 24.

Figure 9:
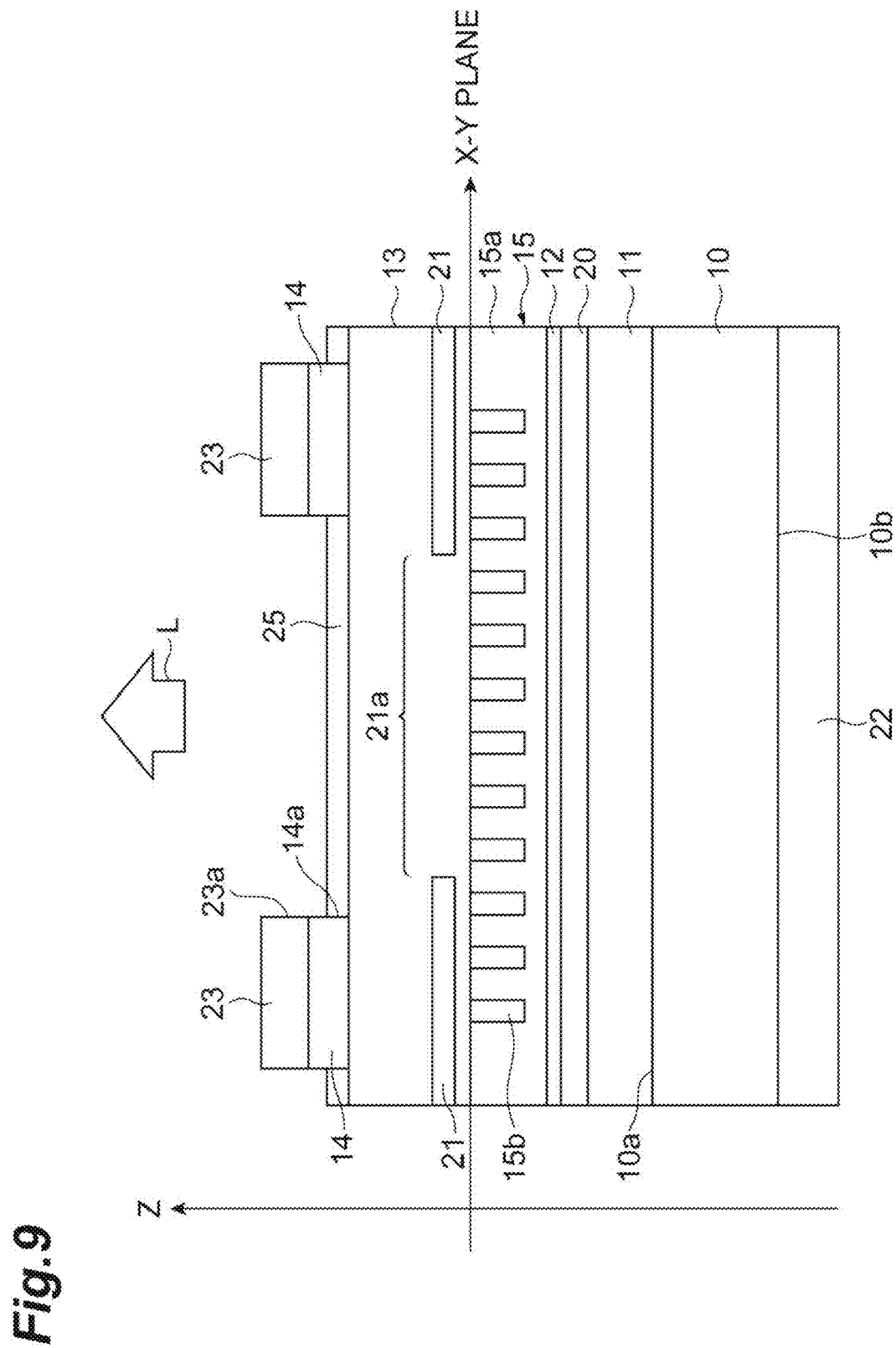
FIG. 9 is a view illustrating a modified example relating to a second electrode.
Figure 10:
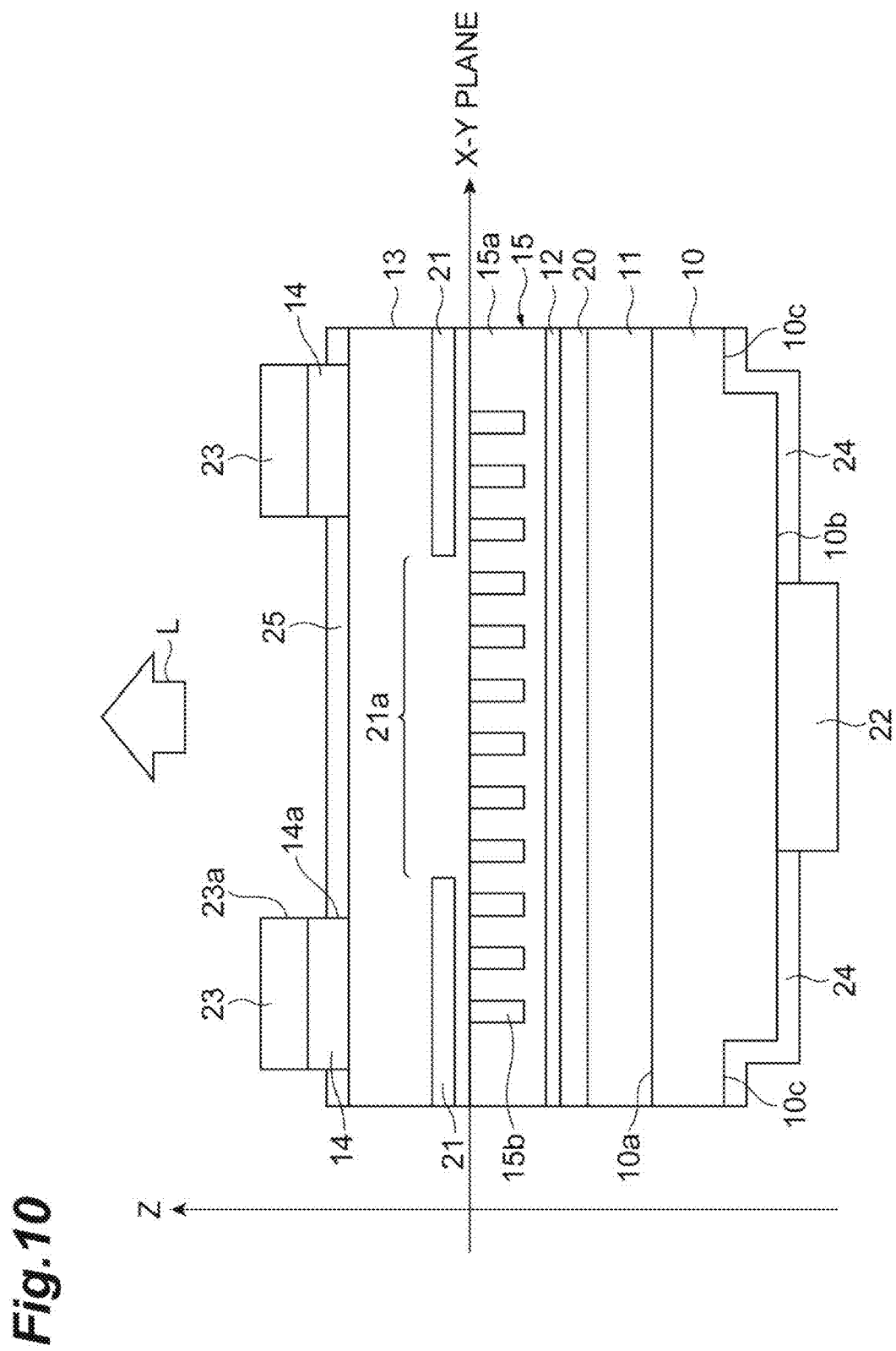
FIG. 10 is a view illustrating a modified example relating to a shape of a semiconductor substrate.

As illustrated in FIG. 9, the electrode 22 may be provided on the entire back surface 10b. In that case, the protective film 24 is unnecessary. In addition, a step 10c may be provided on a peripheral edge portion of the back surface 10b of the semiconductor substrate 10 in order to suppress the wrap-around of solder when mounting the laser device 1A as illustrated in FIG. 10. In this case, the step 10c has a width of, for example, 5 µm to 50 µm and a depth of, for example, 5 µm to 50 µm, and preferably, has the width of about 30 µm and the depth of about 10 µm. The protective film 24 is provided on the step 10c. When the electrode 22 is provided on the entire back surface 10b, the electrode 22 is provided up to a boundary between the back surface 10b and the step 10c as illustrated in FIG. 11.

The anti-reflection film 25 is made of a dielectric single layer film such as silicon nitride (for example, SiN) and silicon oxide (for example, $SiO_2$), or a dielectric multilayer film. For example, it is possible to apply a layer, obtained by stacking two or more types of dielectric layers selected from a dielectric layer group consisting of titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), aluminum oxide ($Al_2O_3$), cerium oxide ($CeO_2$), indium oxide ($In_2O_3$), zirconium oxide ($ZrO_2$), and the like, as the dielectric multilayer film. For example, a film having an optical film thickness of $\lambda/4$ with respect to light of a wavelength $\lambda$ is stacked as the anti-reflection film 25. In addition, the protective film 24 is an insulating film such as silicon nitride (for example, SiN) and silicon oxide (for example, $SiO_2$).

The light reflection layer 20 reflects the light generated in the active layer 12 toward the front surface side of the laser device 1A. The light reflection layer 20 is composed of, for example, a DBR layer in which a plurality of layers having a modified refractive index are alternately stacked. Incidentally, the light reflection layer 20 of the embodiment is provided between the lower cladding layer 11 and the stacked structural body including the active layer 12 and the photonic crystal layer 15. However, the light reflection layer 20 may be provided anywhere between the stacked structural body and the semiconductor substrate 10, and for example, may be provided between the lower cladding layer 11 and the semiconductor substrate 10.

In a first example, the semiconductor substrate 10 is a GaAs substrate, and each of the lower cladding layer 11, the active layer 12, the photonic crystal layer 15, the upper cladding layer 13, the contact layer 14, and the light reflection layer 20 is a compound semiconductor layer made of an element included in the group consisting of Ga, Al, and In of the group III element and As of the group V element. More specifically, the lower cladding layer 11 is an AlGaAs layer, the active layer 12 has a multiple quantum well structure (a barrier layer: AlGaAs/a well layer: InGaAs), the basic layer 15a of the photonic crystal layer 15 is GaAs, the modified refractive index region 15b is a void, the upper cladding layer 13 is an AlGaAs layer, the contact layer 14 is a GaAs layer, and the light reflection layer 20 is an AlGaAs layer.

In a second example, the semiconductor substrate 10 is a GaAs substrate, and each of the lower cladding layer 11, the active layer 12, the photonic crystal layer 15, the upper cladding layer 13, the contact layer 14, and the light reflection layer 20 is a compound semiconductor layer that is not made only of an element included in the group consisting of Ga, Al, and In of the group III element and As of the group V element. More specifically, the lower cladding layer 11 is an AlGaInP layer, the active layer 12 has a multiple quantum well structure (a barrier layer: AlGaInP or GaInP/a well layer: GaInP), the basic layer 15a of the photonic crystal layer 15 is AlGaInP or GaInP, the modified refractive index region 15b is a void, the upper cladding layer 13 is an AlGaInP layer, the contact layer 14 is a GaAs layer, and the light reflection layer 20 is an AlGaInP layer or an AlGaAs layer.

In a third example, the semiconductor substrate 10 is an InP substrate, and the lower cladding layer 11, the active layer 12, the photonic crystal layer 15, the upper cladding layer 13, the contact layer 14, and the light reflection layer 20 may be configured using a compound semiconductor which is not made only of an element included in the group consisting of Ga, Al, and In of the group III element and As of the group V element, for example, an InP-based compound semiconductor. More specifically, the lower cladding layer 11 is an InP layer, the active layer 12 has a multiple quantum well structure (a barrier layer: GaInAsP/a well layer: GaInAsP), the basic layer 15a of the photonic crystal layer 15 is GaInAsP, the modified refractive index region 15b is a void, the upper cladding layer 13 is an InP layer, and the contact layer 14 is a GaInAsP layer.

In a fourth example, the semiconductor substrate 10 is a GaN substrate, and the lower cladding layer 11, the active layer 12, the photonic crystal layer 15, the upper cladding layer 13, the contact layer 14, and the light reflection layer 20 may be a compound semiconductor layer which is not made only of an element included in the group consisting of Ga, Al, and In of the group III element and As of the group V element, and may be configured using, for example, a nitride compound semiconductor. More specifically, the lower cladding layer 11 is an AlGaN layer, the active layer 12 has a multiple quantum well structure (a barrier layer: InGaN/a well layer: InGaN), the basic layer 15a of the photonic crystal layer 15 is GaN, the modified refractive index region 15b is a void, the upper cladding layer 13 is an AlGaN layer, and the contact layer 14 is a GaN layer.

The same conductivity type as that of the semiconductor substrate 10 is imparted to the lower cladding layer 11 and the light reflection layer 20. A conductivity type opposite to that of the semiconductor substrate 10 is imparted to the upper cladding layer 13 and the contact layer 14. In one example, the semiconductor substrate 10, the lower cladding layer 11 and the light reflection layer 20 are the n-type and the upper cladding layer 13 and the contact layer 14 are the p-type. The photonic crystal layer 15 has the same conductivity type as that of the semiconductor substrate 10 in the case of being provided between the active layer 12 and the lower cladding layer 11. When being provided between the active layer 12 and the upper cladding layer 13, the photonic crystal layer 15 has a conductivity type opposite to that of the semiconductor substrate 10. Incidentally, an impurity concentration is, for example, $1 \times 10^{17}$ to $1 \times 10^{21}/cm^3$.

The current confinement layer 21 has a structure that causes the current to hardly pass (or not to pass) therethrough, and has an opening 21a (first opening) in a central portion thereof. As illustrated in FIG. 8, a planar shape of the opening 21a is similar to the shape of the opening 23a of the electrode 23, and is, for example, a square or a circle. The current confinement layer 21 is an Al oxide layer obtained by oxidizing a layer containing Al at a high concentration, for example. Alternatively, the current confinement layer 21 may be a layer formed by injecting protons ($H^+$) into the upper cladding layer 13. Alternatively, the current confinement layer 21 may have a reverse p-n junction structure in which a semiconductor layer having a conductivity type opposite to that of the semiconductor substrate 10 and a semiconductor layer having the same conductivity type as that of the semiconductor substrate 10 are stacked in order.

An opening width (which is a length of one side when the shape of the opening 21a is a square, and a maximum width is a length of diagonal line) Lc of the opening 21a of the current confinement layer 21 is smaller than the opening width (which is the length of one side when the shape of the opening 23a is the square, and the maximum width is the length of diagonal line) La of the opening 23a of the electrode 23. When the electrode 22 is viewed from the electrode 23 along the normal direction (Z-axis direction) of the main surface 10a, the entire region defined by the opening 21a of the current confinement layer 21 fits within a region defined by the opening 23a of the electrode 23. In the example of FIG. 8, the maximum width of the opening 21a of the current confinement layer 21 is also defined by the length of diagonal line of the square.

An exemplary dimension of the laser device 1A according to the embodiment will be described. The opening width (which is the length of one side when the shape of the opening 23a is a square, and the maximum width is the diagonal length) La of the opening 23a of the electrode 23 is, for example, in a range of 5 μm to 100 μm, and is preferably 50 μm. In addition, a thickness (a layer width along the Z-axis direction) ta of the photonic crystal layer 15 is, for example, in a range of 100 nm to 400 nm, and is preferably 200 nm. A distance tb (the distance along the Z-axis direction) between the current confinement layer 21 and the contact layer 14 is, for example, in a range of 2 μm to 50 μm. In other words, the distance tb is within a range of 0.02 La to 10 La (for example, 0.1 La), and is within a range of 5.0 ta to 500 ta (for example, 25 ta). In addition, a thickness (a layer width along the Z-axis direction) tc of the upper cladding layer 13 is larger than the distance tb and is, for example, in a range of 2 μm to 50 μm. In other words, the thickness tc is within a range of 0.02 La to 10 La (for example, 0.1 La), and is within a range of 5.0 to 500 ta (for example, 25 ta). A thickness (a layer width along the Z-axis direction) td of the lower cladding layer 11 is, for example, in a range of 1.0 µm to 3.0 µm (for example, 2.0 µm).

When a driving current is supplied between the electrode 22 and the electrode 23, the driving current reaches the active layer 12. At this time, the current flowing between the electrode 23 and the active layer 12 sufficiently diffuses in the thick upper cladding layer 13 and passes through the opening 21a of the current confinement layer 21, and thus, can be uniformly diffused in the vicinity of the central portion of the active layer 12. Then, light emission occurs due to recombination of electrons and voids in the active layer 12. The electrons and voids contributing to the light emission and the generated light are efficiently confined between the lower cladding layer 11 and the upper cladding layer 13. The light emitted from the active layer 12 enters the inside of the photonic crystal layer 15 and forms a predetermined mode in accordance with the lattice structure inside the photonic crystal layer 15. The laser light L emitted from the photonic crystal layer 15 is reflected by the light reflection layer 20 and emitted from the upper cladding layer 13 to the outside of the laser device 1A passing through the opening 14a and the opening 23a. At this time, the laser light L is emitted in the direction (Z-axis direction) orthogonal to the main surface 10a.

Figure 12A:
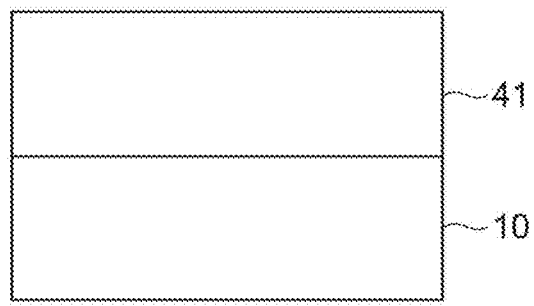
FIGS. 12A to 12C are views for describing a method of manufacturing the semiconductor laser device according to the embodiment (formation of a current confinement layer by oxidation) (Part 1)
Figure 12B:
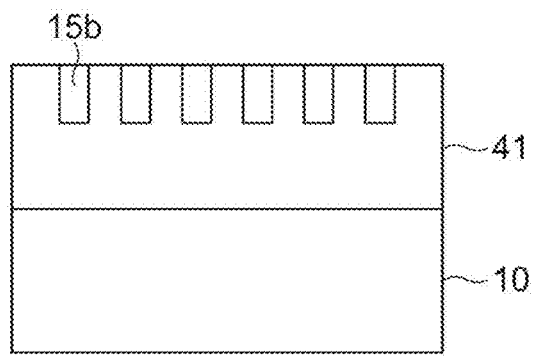
Figure 12C:
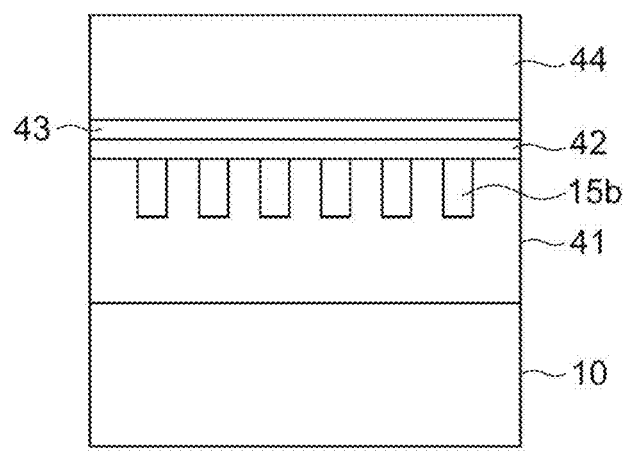
Figure 13A:
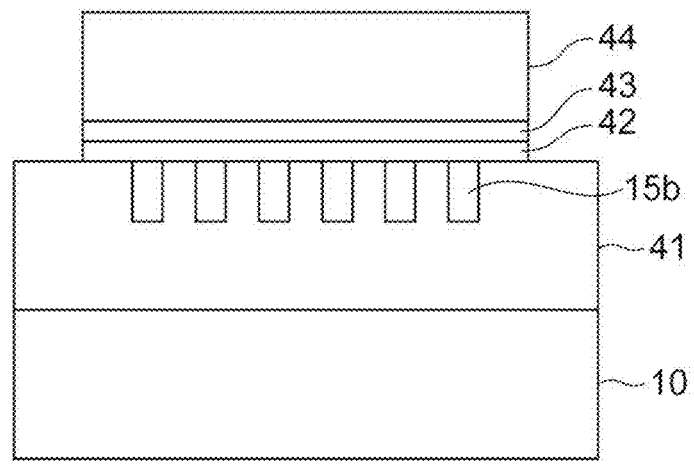
FIGS. 13A and 13B are views for describing the method of manufacturing the semiconductor laser device according to the embodiment (formation of the current confinement layer by oxidation) (Part 2)
Figure 13B:
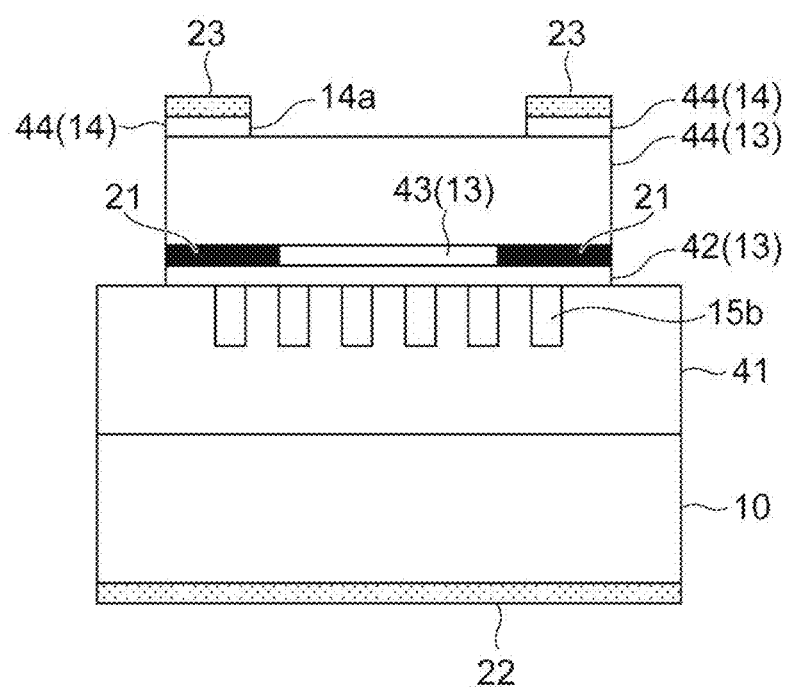
Figure 14A:
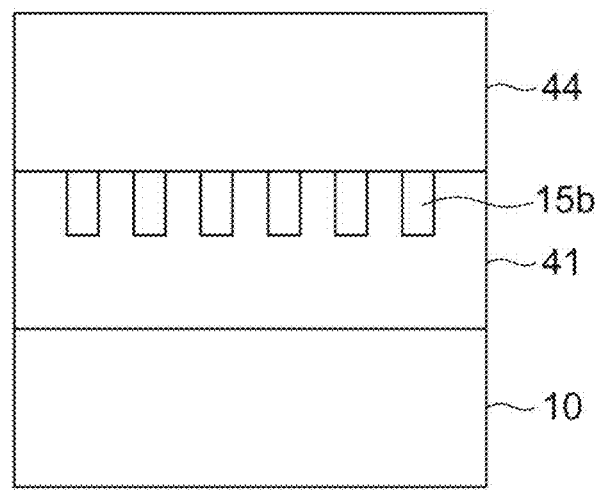
FIGS. 14A and 14B are views for describing the method of manufacturing the semiconductor laser device according to the embodiment (formation of a current confinement layer by proton injection) (Part 1)
Figure 14B:
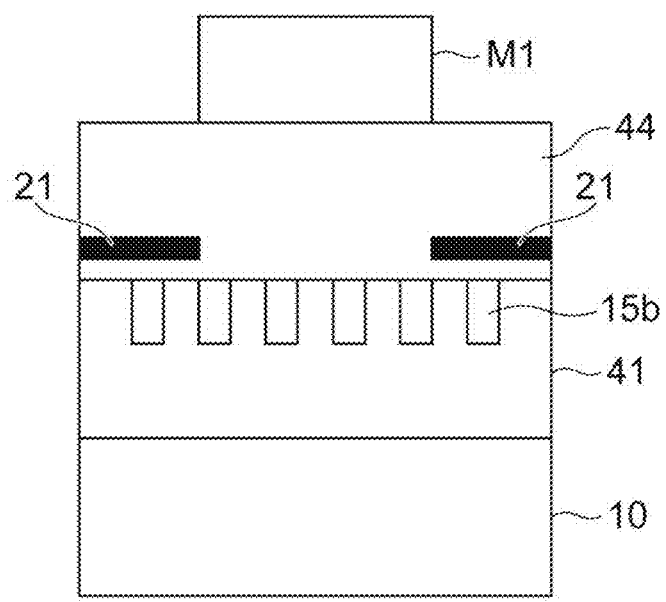
Figure 15:
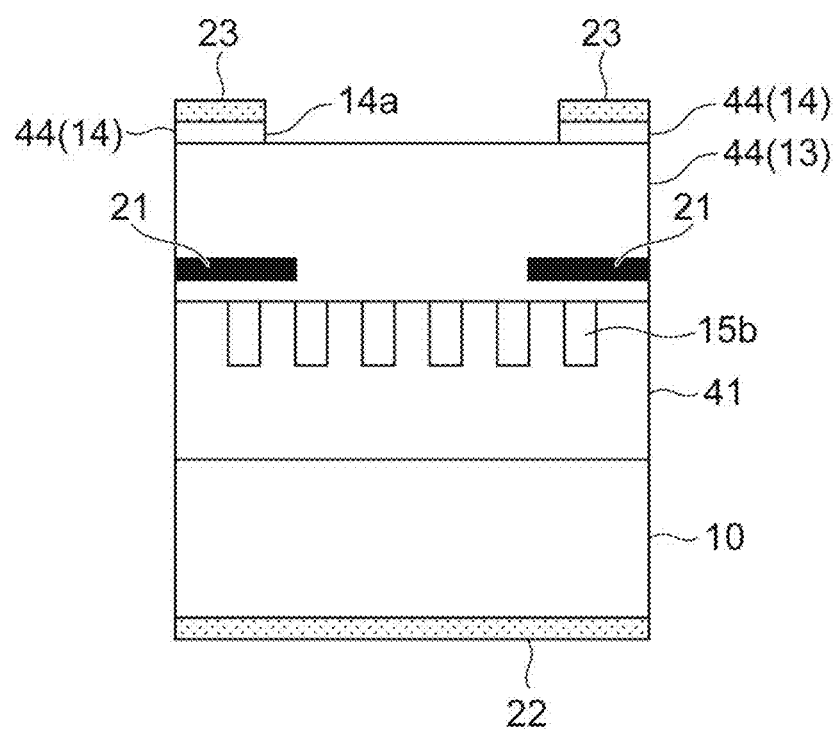
FIG. 15 is a view for describing the method of manufacturing the semiconductor laser device according to the embodiment (formation of the current confinement layer by proton injection) (Part 2)

FIGS. 12A to 14B, 15, and 16A to 19B are views for describing a method of manufacturing the laser device 1A according to the embodiment. FIGS. 12A to 12C and 13A to 13B illustrate a manufacturing method in which the current confinement layer 21 is formed by oxidation. FIGS. 14A to 14B and 15 illustrate a manufacturing method in which the current confinement layer 21 is formed by proton injection. FIGS. 16A to 16C and 17A to 17B illustrate a manufacturing method (first example) in which the current confinement layer 21 is formed by the reverse p-n junction structure. FIGS. 18A to 18C and 19A to 19B illustrate another manufacturing method (second example) in which the current confinement layer 21 is formed by the reverse p-n junction structure.

<Formation of Current Confinement Layer by Oxidation>

First, a first stacked portion 41 is formed on the semiconductor substrate 10 by epitaxial growth as illustrated in FIG. 12A (a first growth process). The first stacked portion 41 includes the lower cladding layer 11, the light reflection layer 20, the active layer 12, and the basic layer 15a of the photonic crystal layer 15. The first stacked portion 41 includes the stacked structural body formed of the active layer 12 and the photonic crystal layer 15. That is, the lower cladding layer 11, the light reflection layer 20, the active layer 12, and the basic layer 15a of the photonic crystal layer 15 are successively formed by the epitaxial growth in the first growth process. As a method of growing the first stacked portion 41, for example, metal organic chemical vapor deposition (MOCVD) is used. Incidentally, a thin layer for preventing oxidation (for example, an undoped GaInP layer when the semiconductor substrate 10 is the GaAs substrate) may be formed on the basic layer 15a. Next, an etching mask is formed on the basic layer 15a of the photonic crystal layer 15, which is the uppermost layer of the first stacked portion 41, using a microfabrication technique such as an electron beam lithography method. As the basic layer 15a is etched through an opening of the etching mask, the plurality of modified refractive index regions 15b illustrated in FIG. 12B are formed (a modified refractive index region formation process). In this manner, the photonic crystal layer 15 having the plurality of modified refractive index regions 15b is formed inside the basic layer 15a.

Subsequently, semiconductor layers 42 and 43 and a second stacked portion 44 are successively formed on the photonic crystal layer 15 by epitaxial growth as illustrated in FIG. 12C (a second growth process). For example, MOCVD is used as a method of growing the semiconductor layers 42, 43 and the second stacked portion 44. The semiconductor layer 42 is a layer which is to serve as a part of the upper cladding layer 13 and has the same composition as the upper cladding layer 13. The semiconductor layer 43 is a layer to form the current confinement layer 21, and is, for example, an Al-containing layer having a high Al composition. When the semiconductor substrate 10 is the GaAs substrate, the semiconductor layer 43 is, for example, an AlGaAs layer or an AlAs layer having an Al composition ratio of 95% or higher. A thickness of the semiconductor layer 43 is, for example, 5 nm to 50 nm (typically about 20 nm or smaller). The second stacked portion 44 includes the remaining portion of the upper cladding layer 13 and the contact layer 14. Incidentally, the semiconductor layers 42 and 43 may be doped with impurities having the same conductivity type as that of the upper cladding layer 13, whereby it is possible to suppress an increase of a driving voltage.

Subsequently, etching is performed on the semiconductor layers 42 and 43 and the second stacked portion 44 as illustrated in FIG. 13A. As a result, the semiconductor layers 42 and 43 and the second stacked portion 44 are processed into a mesa shape. Subsequently, steam oxidation is performed from the periphery of the semiconductor layer 43 as illustrated in FIG. 13B. As a peripheral edge portion excluding a central portion of the semiconductor layer 43 is oxidized in this manner, the current confinement layer 21 mainly including insulating AlO is formed. Incidentally, the central portion of the semiconductor layer 43 which is not oxidized is to serve as an opening portion of the current confinement layer 21 and forms a part of the upper cladding layer 13. Thereafter, a part of the contact layer 14 of the second stacked portion 44 is etched, whereby the opening 14a of the contact layer 14 is formed. Further, the electrode 23 is formed on the contact layer 14, and the electrode 22 is formed on the back surface of the semiconductor substrate 10. The laser device 1A is manufactured through the above processes.

In a case where the current confinement layer 21 is formed by oxidation as described above, it is possible to control a position of the current confinement layer 21 in the thickness direction (Z-axis direction) of the laser device 1A with high accuracy even when the upper cladding layer 13 is thick as compared to a case where the current confinement layer 21 is formed by proton injection. Further, the current confinement layer 21 can be formed without damaging the upper cladding layer 13 and the contact layer 14. In addition, it is possible to suppress an increase of a loss caused by diffusion of a dopant into the upper cladding layer 13 and a change in the doping concentration as compared to a case where the current confinement layer 21 is formed by the reverse p-n junction structure.

<Formation of Current Confinement Layer by Proton Injection>

As illustrated in FIG. 14A, the first stacked portion 41 including the plurality of modified refractive index regions 15b is formed on the semiconductor substrate 10 in the same manner as in the above-described manufacturing method <Formation of Current Confinement Layer by Oxidation> (a first growth process and modified refractive index region formation process). Thereafter, the second stacked portion 44 is formed on the first stacked portion 41 by epitaxial growth (a second growth process). Subsequently, a resist mask M1 is formed on the second stacked portion 44 as illustrated in FIG. 14B. The resist mask M1 has an outer edge along a contour of the opening 21a of the current confinement layer 21. Then, protons (H+) are injected into a part of the second stacked portion 44 that is exposed from the resist mask M1. As a result, the current confinement layer 21 which is a high-resistance region containing high-concentration protons is formed. At this time, a position in a depth direction of the high-resistance region can be controlled by adjusting an acceleration voltage of proton injection. After removing the resist mask M1, a part of the contact layer 14 of the second stacked portion 44 is etched as illustrated in FIG. 15. As a result, the opening 14a of the contact layer 14 is formed. Further, the electrode 23 is formed on the contact layer 14, and the electrode 22 is formed on the back surface of the semiconductor substrate 10. The laser device 1A is manufactured through the above processes.

When the current confinement layer 21 is formed by proton injection as described above, the opening width of the opening 21a can be controlled with high accuracy as compared to the case where the current confinement layer 21 is formed by oxidation. In addition, it is possible to suppress the increase of the loss caused by diffusion of the dopant into the upper cladding layer 13 and the change in doping concentration as compared to the case where the current confinement layer 21 is formed by the reverse p-n junction structure.

<First Example of Forming Current Confinement Layer by Reverse P-N Junction Structure>

Figure 16A:
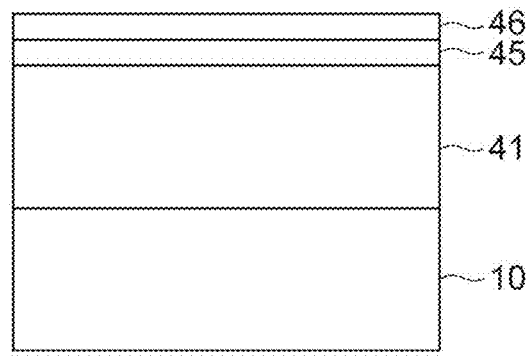
FIGS. 16A to 16C are views for describing the method of manufacturing the semiconductor laser device according to the embodiment (a first example of forming a current confinement layer by a reverse p-n junction structure) (Part 1)

First, the first stacked portion 41, a semiconductor layer 45, and a semiconductor layer 46 are successively formed on the semiconductor substrate 10 by epitaxial growth as illustrated in FIG. 16A (a first growth process). The semiconductor layer 45 is a layer of a conductivity type (for example, a p-type) opposite to that of the semiconductor substrate 10, and is, for example, a p-type AlGaInP layer when the semiconductor substrate 10 is an n-type GaAs substrate. In addition, the semiconductor layer 46 is a layer of the same conductivity type (for example, an n-type) as that of the semiconductor substrate 10, and is, for example, an n-type AlGaInP layer when the semiconductor substrate is the n-type GaAs substrate. Each thicknesses of the semiconductor layers 45 and 46 is, for example, 100 nm.

Figure 16B:
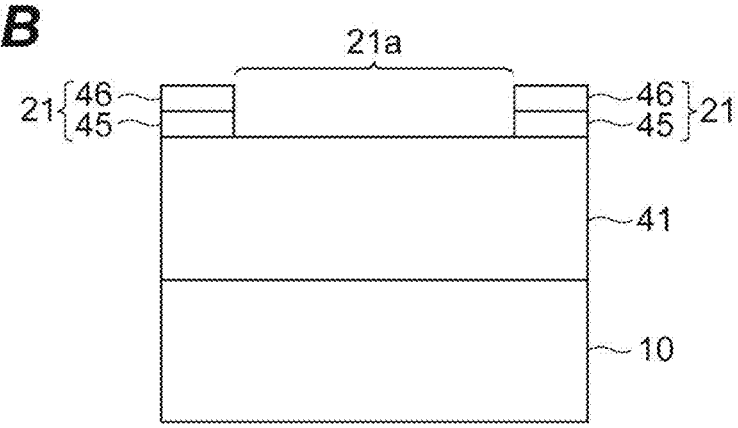
Figure 16C:
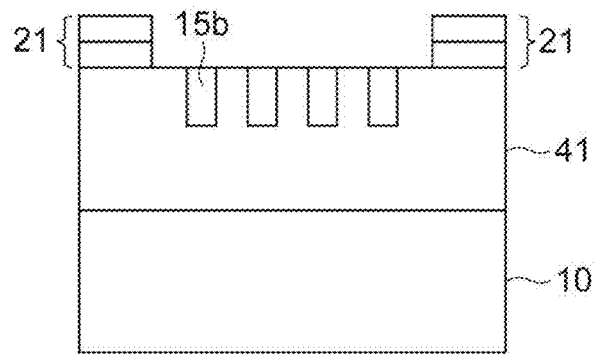

Next, an etching mask is formed on the semiconductor layer 46 by using a typical photolithography technique. Then, the semiconductor layers 45 and 46 are etched through an opening of the etching mask until the first stacked portion 41 is exposed. As a result, the current confinement layer 21 having the reverse p-n junction structure and the opening 21a is formed as illustrated in FIG. 16B. Subsequently, an etching mask is formed on the basic layer 15a of the first stacked portion 41 exposed from the opening 21a by using a microfabrication technique such as an electron beam lithography method. As the basic layer 15a is etched through the opening of the etching mask, the plurality of modified refractive index regions 15b illustrated in FIG. 16C are formed.

Figure 17A:
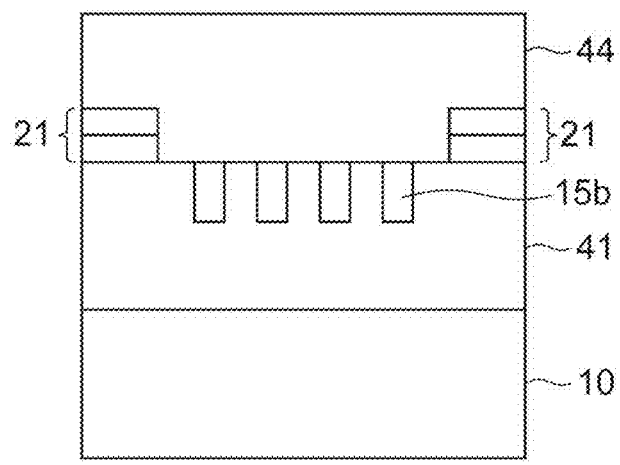
FIGS. 17A and 17B are views for describing the method of manufacturing the laser device according to the embodiment (the first example of forming the current confinement layer by the reverse p-n junction structure) (Part 2)
Figure 17B:
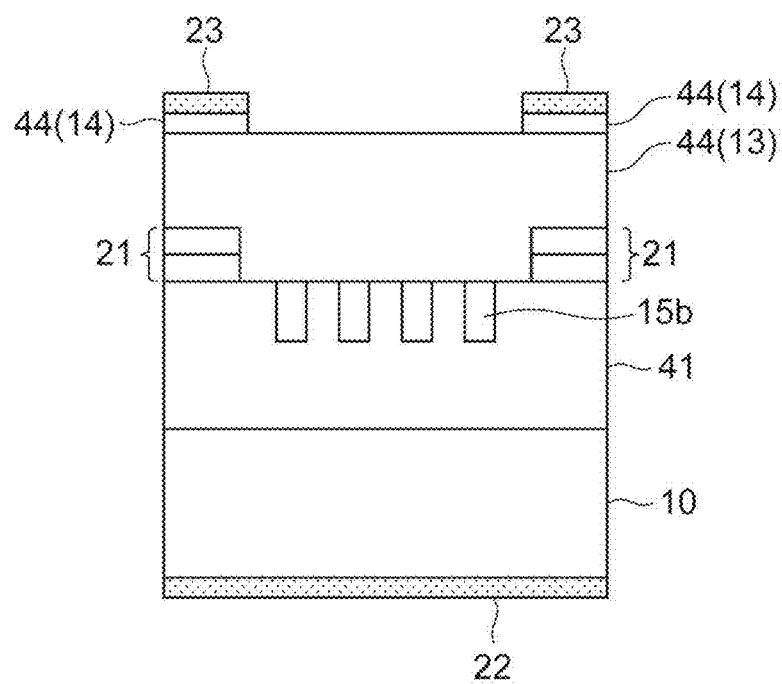

Subsequently, the second stacked portion 44 is formed on the current confinement layer 21 and the first stacked portion 41 exposed from the opening 21a of the current confinement layer 21 by epitaxial growth as illustrated in FIG. 17A (a second growth process). Thereafter, the opening 14a of the contact layer 14 is formed by etching a part of the contact layer 14 of the second stacked portion 44 as illustrated in FIG. 17B. Further, the electrode 23 is formed on the contact layer 14, and the electrode 22 is formed on the back surface of the semiconductor substrate 10. The laser device 1A is manufactured through the above processes.

When the current confinement layer 21 is formed by the reverse p-n junction structure as described above, the opening width of the opening 21a can be controlled with high accuracy as compared to the case where the current confinement layer 21 is formed by oxidation. In addition, it is possible to control the position of the current confinement layer 21 in the thickness direction (Z-axis direction) of the laser device 1A with high accuracy even when the upper cladding layer 13 is thick as compared to the case where the current confinement layer 21 is formed by proton injection. In addition, the current confinement layer 21 can be formed without damaging the upper cladding layer 13 and the contact layer 14. Further, it is possible to form the current confinement layer 21 only by typical semiconductor processes such as the semiconductor growth and etching, and thus, it is easy to form the current confinement layer 21 as compared to the case where the current confinement layer 21 is formed by oxidation or proton injection.

<Second Example of Forming Current Confinement Layer by Reverse P-N Junction Structure>

Figure 18A:
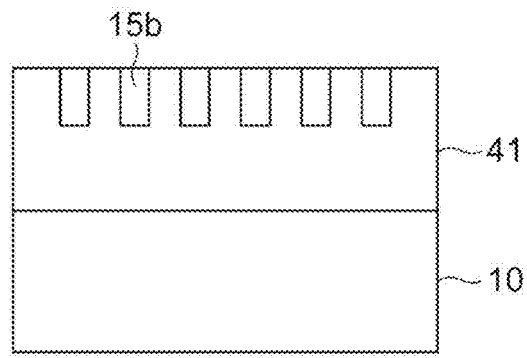
FIGS. 18A to 18C are views for describing the method of manufacturing the laser device according to the embodiment (a second example of forming the current confinement layer by the reverse p-n junction structure) (Part 1)
Figure 18B:
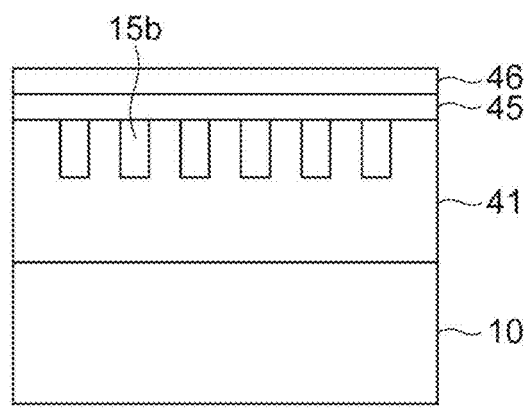
Figure 18C:
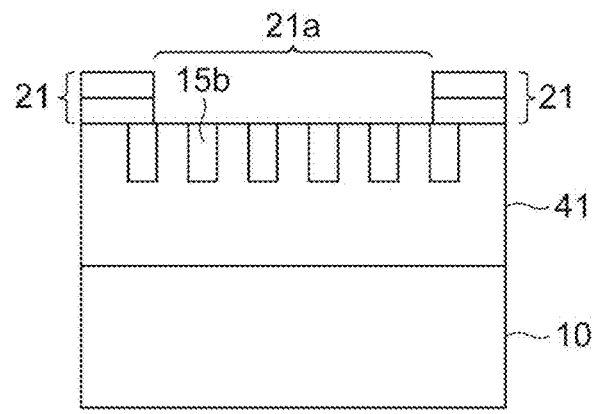

As illustrated in FIG. 18A, the first stacked portion 41 including the plurality of modified refractive index regions 15b is formed on the semiconductor substrate 10 in the same manner as in the above-described manufacturing method <Formation of Current Confinement Layer by Oxidation> (a first growth process and modified refractive index region formation process). Next, the semiconductor layers 45 and 46 are successively formed on the first stacked portion 41 by epitaxial growth as illustrated in FIG. 18B (a second growth process). Configurations (material and thickness) of the semiconductor layers 45 and 46 are the same as those in the first example described above. Subsequently, an etching mask is formed on the semiconductor layer 46 using a typical photolithography technique. The semiconductor layers 45 and 46 are etched through openings of the etching mask until the first stacked portion 41 is exposed. As a result, the current confinement layer 21 having the reverse p-n junction structure and the opening 21a is formed as illustrated in FIG. 18C.

Figure 19A:
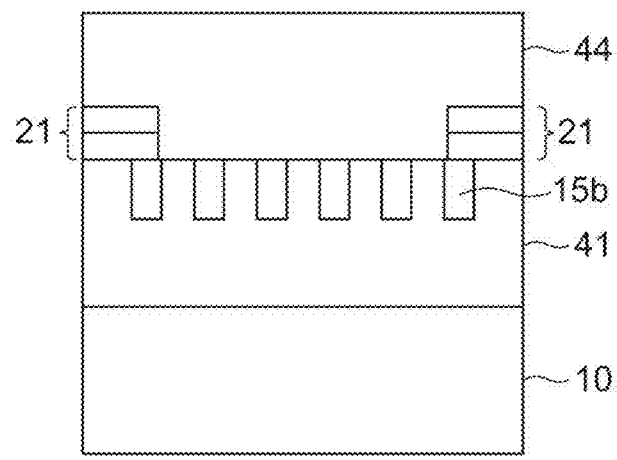
FIGS. 19A and 19B are views for describing the method of manufacturing the laser device according to the embodiment (the second example of forming the current confinement layer by the reverse p-n junction structure) (Part 2)
Figure 19B:
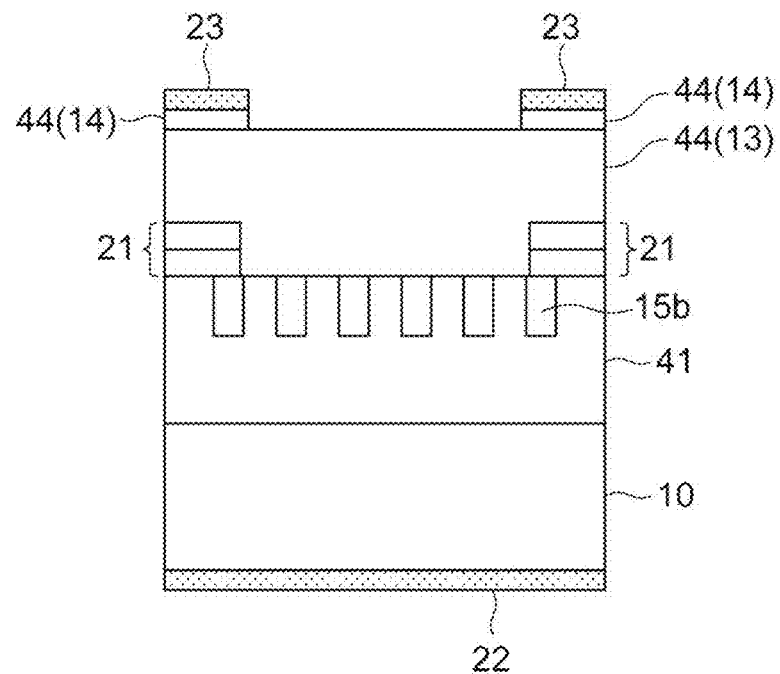

Subsequently, the second stacked portion 44 is formed on the current confinement layer 21 and the first stacked portion 41 exposed from the opening 21a of the current confinement layer 21 by epitaxial growth as illustrated in FIG. 19A (a third growth process). Thereafter, the opening 14a of the contact layer 14 is formed by etching a part of the contact layer 14 of the second stacked portion 44 as illustrated in FIG. 19B. Further, the electrode 23 is formed on the contact layer 14, and the electrode 22 is formed on the back surface of the semiconductor substrate 10. The laser device 1A is manufactured through the above processes. Incidentally, advantages of this second example is the same as those in the first example described above.

Effect that can be obtained by the laser device 1A according to the embodiment described above will be described. In the laser device 1A, the opening 23a is formed in the electrode 23 provided on the contact layer 14. That is, the laser device 1A has the front surface emission configuration in which the laser light L is emitted from the side (the side of the contact layer 14) opposite to the back surface 10b of the semiconductor substrate 10. Therefore, the loss caused by absorption of light in the semiconductor substrate 10 is reduced, and it is possible to enhance emission efficiency of the laser light L. Such a configuration is advantageous in the configuration in which GaAs is used for the semiconductor substrate 10, particularly, in the case of outputting an optical image of a visible light region to a near-infrared region (for example, a wavelength of 600 nm to 920 nm).

In the case of the front surface emission, a problem is to sufficiently diffuse a current to the region of the active layer 12 overlapping with the opening 23a of the electrode 23 (typically in the vicinity of the central portion of the active layer 12 projected on the X-Y plane along the Z-axis direction). Therefore, the current confinement layer 21 is provided in the upper cladding layer 13 in the laser device 1A. The current confinement layer 21 has the opening 21a which allows the current to pass therethrough. As illustrated in FIGS. 8 and 11, the opening width Lc of the opening 21a and the maximum width thereof are smaller than the opening width La of the opening 23a and the maximum width thereof. In addition, when the electrode 22 is viewed from the electrode 23 along the normal direction of the main surface 10a, the entire region defined by the opening 21a falls within the region defined by the opening 23a. According to such a configuration, it is possible to sufficiently diffuse the current also to the region of the active layer 12 overlapping with the opening 23a of the electrode 23 (particularly in the vicinity of the central portion of the active layer 12).

In addition, the laser device 1A according to the embodiment may include the light reflection layer 20 provided between the stacked structural body (including the active layer 12 and the photonic crystal layer 15) and the semiconductor substrate 10. As a result, the loss caused by light absorption in the semiconductor substrate 10 is avoided, and it is possible to further enhance the emission efficiency of the laser light L. In this case, the light reflection layer 20 may be the DBR layer. As a result, it is possible to easily form the light reflection layer 20 in the same process as the other semiconductor layers. In this case, the light reflection layer 20 may be provided between the stacked structural body and the lower cladding layer 11. As a result, the loss caused by light absorption in the lower cladding layer 11 is also avoided, and it is possible to further enhance the emission efficiency of the laser light L.

In addition, the distance between the contact layer 14 and the current confinement layer 21 in the thickness direction (Z-axis direction) of the upper cladding layer 13 may be 2 μm or longer as in the embodiment. As the sufficiently long distance between the contact layer 14 and the current confinement layer 21 is secured in this manner, the current easily diffuses to the vicinity of the center of the opening 21a of the current confinement layer 21. As a result, it is possible to sufficiently diffuse the current to the region of the active layer 12 overlapping with the opening 23a of the electrode 23. From the viewpoint of diffusion of the current, it is better as the distance between the contact layer 14 and the current confinement layer 21 is longer. For example, the distance may be 3 μm or longer, 5 μm or longer, or 10 μm or longer.

In addition, the band gap of each layer existing between the contact layer 14 and the active layer 12 may be larger than the band gap of the active layer 12 as in the embodiment. As a result, the absorption of light between the contact layer 14 and the active layer 12 is reduced, and it is possible to further enhance the emission efficiency of the laser light L.

In addition, the maximum width of the electrode 22 (a maximum length of the electrode 22 defined along the direction parallel to the X-Y plane) is smaller than the opening width of the opening 21a and the maximum width thereof as in the embodiment (FIGS. 1, 2, and 10). In addition, the entire electrode 22 may fit within the region defined by the opening 21a when the electrode 22 is viewed from the electrode 23 along the normal direction of the main surface 10a. As a result, even if a leakage occurs through a defect or a hole in the current confinement layer 21 due to an error in manufacturing, a path of the current flowing from a leakage portion to the electrode 23 has a high resistance since the electrode 23 is formed inside the opening 21a so that the current leakage can be effectively suppressed. As described above, it is possible to enhance the reliability of the laser device 1A in injection of the current into the active layer 12 immediately below the opening 21a according to the embodiment. Incidentally, the electrode 23 may be formed on the entire back surface 10b of the semiconductor substrate 10 when it is possible to obtain sufficient accuracy at the time of manufacturing the laser device 1A.

First Specific Example

Here, a specific example of the laser device 1A according to the embodiment will be described. FIG. 20 is a table illustrating a layer structure of the laser device 1A according to a first specific example. As illustrated in FIG. 20, in this first specific example, n-type GaAs is applied as the semiconductor substrate 10 and an n-type GaAs buffer layer and the lower cladding layer 11 made of n-type are provided on the semiconductor substrate 10. The active layer 12 is provided on the lower cladding layer 11. The active layer 12 has a multiple quantum well structure in which a barrier layer made of undoped $(Al_xGa_{1-x})_{0.5}In_{0.5}P$ (for example, x is about 0.03) and a well layer made of undoped GaInP are alternately stacked. The number of layers of the well layer is three, and the number of layers of the barrier layer is four. According to the active layer 12, it is possible to generate light having a wavelength of 690 nm. The photonic crystal layer 15 is provided on the active layer 12. A lower layer part of the photonic crystal layer 15 is constituted by only a carrier block layer made of undoped $(Al_{0.7}Ga_{0.3})_{0.5}In_{0.5}P$ and the basic layer 15a made of undoped $(Al_xGa_{1-x})_{0.5}In_{0.5}P$ (for example, x is about 0.03). On the other hand, an upper layer part of the photonic crystal layer 15 is constituted by the basic layer 15a made of undoped $(Al_xGa_{1-x})_{0.5}In_{0.5}P$ (for example, x is about 0.03) and the modified refractive index region 15b formed using a void. The upper cladding layer 13 made of p-type $(Al_{0.7}Ga_{0.3})_{0.5}In_{0.5}P$ and the contact layer 14 made of p-type GaAs are provided on the photonic crystal layer 15. Incidentally, a refractive index, a thickness, a dopant and a doping concentration of each layer, and a value of an optical confinement factor Γ are the same as those of FIG. 20. In addition, a filling factor of the photonic crystal layer 15 is 15%. In addition, x in the table represents a composition ratio of Al.

Second Specific Example

FIG. 21 is a table illustrating a layer structure of the laser device 1A according to a second specific example. As illustrated in FIG. 21, in this second specific example, n-type GaAs is applied as the semiconductor substrate 10, and an n-type GaAs buffer layer and the lower cladding layer 11 made of n-type $Al_{0.8}GaAs$ is provided on the semiconductor substrate 10. The active layer 12 is provided on the lower cladding layer 11. The active layer 12 has a multiple quantum well structure in which a barrier layer made of undoped $Al_{0.3}GaAs$ and a well layer made of undoped GaAs are alternately stacked. The number of layers of the well layer is three, and the number of layers of the barrier layer is four. According to the active layer 12, it is possible to generate light having a wavelength of 850 nm. The photonic crystal layer 15 is provided on the active layer 12. A lower layer part of the photonic crystal layer 15 is constituted by only a carrier block layer made of undoped $Al_{0.8}GaAs$ and the basic layer 15a made of undoped $Al_{0.3}GaAs$. On the other hand, an upper layer part of the photonic crystal layer 15 is constituted by the basic layer 15a made of undoped $Al_{0.3}GaAs$ and the modified refractive index region 15b composed of voids. The upper cladding layer 13 made of p-type $Al_{0.6}GaAs$ and the contact layer 14 made of p-type GaAs are provided on the photonic crystal layer 15. Incidentally, a refractive index, a thickness, a dopant and a doping concentration of each layer, and a value of an optical confinement factor F are the same as those of FIG. 21. In addition, a filling factor of the photonic crystal layer 15 is 17.5%.

The semiconductor laser device according to the embodiment is not limited to the above-described configuration, and various other modifications can be made. For example, the laser device made of the semiconductors of GaAs-base, InP-base, and nitride-base (particularly, GaN-base) compounds has been exemplified in the above-described embodiment and specific examples, the embodiment can be applied to laser devices made of various semiconductor materials other than these materials.

As described above, it is possible to enhance the emission efficiency of laser light according to the semiconductor laser device of the embodiment.

It is obvious that the invention can be variously modified from the above description of the invention. It is difficult to regard that such modifications depart from a gist and a scope of the invention, and all the improvements obvious to those skilled in the art are included in the following claims.

What is claimed is:

1. A semiconductor laser device comprising:
a semiconductor substrate having a main surface and a back surface opposing the main surface;
a first cladding layer provided on the main surface of the semiconductor substrate;
an active layer provided on the first cladding layer;
a second cladding layer provided on the active layer;
a contact layer provided on the second cladding layer;
a first electrode provided on the contact layer;
a second electrode provided on the back surface of the semiconductor substrate;
a photonic crystal layer provided in one of a space between the first cladding layer and the active layer and a space between the active layer and the second cladding layer;
a light reflection layer provided between a stacked structural body and the semiconductor substrate, the stacked structural body including the active layer and the photonic crystal layer; and
a current confinement layer provided in the second cladding layer and having a first opening configured to allow a current to pass therethrough,
wherein the photonic crystal layer has a basic layer and a plurality of modified refractive index regions each having a refractive index different from a refractive index of the basic layer,
the plurality of modified refractive index regions are arranged in a state of being separated from each other on a cross section of the photonic crystal layer orthogonal to a normal direction of the main surface,
the first electrode has a second opening configured to allow laser light to pass therethrough,
a maximum width of the first opening defined along a horizontal direction orthogonal to the normal direction is smaller than a maximum width of the second opening defined along the horizontal direction, and
as viewed from the first electrode side toward the second electrode side along the normal direction, the first opening and the second opening are arranged such that a whole first region defined by the first opening fits within a second region defined by the second opening.

2. The semiconductor laser device according to claim 1, wherein the light reflection layer includes a DBR layer.

3. The semiconductor laser device according to claim 1, wherein the light reflection layer is provided between the stacked structural body and the first cladding layer.

4. The semiconductor laser device according to claim 1, wherein a distance between the contact layer and the current confinement layer defined along the normal direction is 2 μm or longer.

5. The semiconductor laser device according to claim 1, wherein a band gap of each layer existing between the contact layer and the active layer is larger than a band gap of the active layer.

6. A semiconductor laser device comprising:
a semiconductor substrate having a main surface and a back surface opposing the main surface;
a first cladding layer provided on the main surface of the semiconductor substrate;
an active layer provided on the first cladding layer;
a second cladding layer provided on the active layer;
a contact layer provided on the second cladding layer;
a first electrode provided on the contact layer;
a second electrode provided on the back surface of the semiconductor substrate;
a photonic crystal layer provided in one of a space between the first cladding layer and the active layer and a space between the active layer and the second cladding layer; and
a current confinement layer provided in the second cladding layer and having a first opening configured to allow a current to pass therethrough,
wherein the photonic crystal layer has a basic layer and a plurality of modified refractive index regions each having a refractive index different from a refractive index of the basic layer,
the plurality of modified refractive index regions are arranged in a state of being separated from each other on a cross section of the photonic crystal layer orthogonal to a normal direction of the main surface,
the first electrode has a second opening configured to allow laser light to pass therethrough,
a maximum width of the first opening defined along a horizontal direction orthogonal to the normal direction is smaller than a maximum width of the second opening defined along the horizontal direction,
as viewed from the first electrode side toward the second electrode side along the normal direction, the first opening and the second opening are arranged such that a whole first region defined by the first opening fits within a second region defined by the second opening,
a maximum width of the second electrode defined along the horizontal direction is smaller than the maximum width of the first opening, and
as viewed from the first electrode side toward the second electrode side along the normal direction, the second electrode is arranged such that the whole second electrode fits within the first region defined by the first opening.

\* \* \* \* \*